(12) United States Patent
Lee et al.

(10) Patent No.: US 11,984,448 B2
(45) Date of Patent: May 14, 2024

(54) SEMICONDUCTOR DEVICE

(71) Applicant: Samsung Electronics Co., Ltd., Suwon-si (KR)

(72) Inventors: Bok Young Lee, Seoul (KR); Young Mook Oh, Hwaseong-si (KR); Hyung Goo Lee, Seoul (KR); Hae Geon Jung, Yongin-si (KR); Seung Mo Ha, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 255 days.

(21) Appl. No.: 17/509,265

(22) Filed: Oct. 25, 2021

(65) Prior Publication Data
US 2022/0231015 A1     Jul. 21, 2022

(30) Foreign Application Priority Data
Jan. 15, 2021     (KR) .......................... 10-2021-0006081

(51) Int. Cl.
*H01L 27/088*     (2006.01)
*H01L 21/762*     (2006.01)
*H01L 21/8238*     (2006.01)
*H01L 27/092*     (2006.01)

(52) U.S. Cl.
CPC .... *H01L 27/0886* (2013.01); *H01L 21/76232* (2013.01); *H01L 21/823821* (2013.01); *H01L 21/823878* (2013.01); *H01L 27/0924* (2013.01)

(58) Field of Classification Search
CPC ............. H01L 27/0886; H01L 27/0924; H01L 21/76232; H01L 21/823821; H01L 21/823878
See application file for complete search history.

(56) References Cited

U.S. PATENT DOCUMENTS

| | | |
|---|---|---|
| 8,969,974 B2 | 3/2015 | Liaw |
| 9,171,925 B2 | 10/2015 | Kuo et al. |
| 9,337,196 B2 | 5/2016 | Cheng et al. |
| 9,941,271 B2 | 4/2018 | Ponoth et al. |
| 10,062,617 B2 | 8/2018 | Xie et al. |
| 10,263,014 B2 | 4/2019 | Cheng |
| 10,396,185 B2 | 8/2019 | Doris et al. |
| 10,461,082 B2 | 10/2019 | Rachmady et al. |
| 10,559,468 B2 | 2/2020 | Arghavani et al. |
| 2019/0348414 A1* | 11/2019 | Hong ............... H01L 21/823481 |
| 2020/0013881 A1 | 1/2020 | Chang et al. |
| 2020/0051976 A1* | 2/2020 | Ha .................. H01L 21/823481 |
| 2020/0203344 A1 | 6/2020 | Wang et al. |

* cited by examiner

*Primary Examiner* — Christine A Enad
(74) *Attorney, Agent, or Firm* — Harness, Dickey & Pierce, P.L.C.

(57) ABSTRACT

A semiconductor device is provided. The semiconductor device includes a substrate, a first base fin protruding from the substrate and extending in a first direction, and a first fin type pattern protruding from the first base fin and extending in the first direction. The first base fin includes a first sidewall and a second sidewall, the first and second sidewalls extending in the first direction, the first sidewall opposite to the second sidewall, the first sidewall of the first base fin at least partially defines a first deep trench, the second sidewall of the first base fin at least partially defines a second deep trench, and a depth of the first deep trench is greater than a depth of the second deep trench.

15 Claims, 43 Drawing Sheets

SEMICONDUCTOR DEVICE

This application claims priority from Korean Patent Application No. 10-2021-0006081 filed on Jan. 15, 2021 in the Korean Intellectual Property Office, and all the benefits accruing therefrom under 35 U.S.C. § 119, the contents of which in its entirety are herein incorporated by reference.

BACKGROUND

Some example embodiments relate to a semiconductor device.

As one of scaling technologies for increasing the density of semiconductor devices, a proposal includes a multi gate transistor in which a multi-channel active pattern (e.g. a silicon body) having a fin and/or nanowire shape is formed on a substrate and a gate is formed on the surface of the multi-channel active pattern.

Since such a multi-gate transistor utilizes three-dimensional channels, scaling is more easily performed. Additionally or alternatively, a current control capability may be improved even when not increasing a gate length of the multi-gate transistor. Additionally or alternatively, a SCE (short channel effect) in which potential of a channel region is influenced by a drain voltage may be more effectively suppressed.

SUMMARY

Some example embodiments provide a semiconductor device capable of improving element performance and reliability.

Additionally or alternatively, some example embodiments provide a method for fabricating a semiconductor device capable of improving element performance and reliability.

According to some example embodiments, there is provided a semiconductor device comprising a substrate, a first base fin protruding from the substrate and extending in a first direction, and a first fin type pattern protruding from the first base fin and extending in the first direction. The first base fin includes a first sidewall and a second sidewall, the first and second sidewalls extending in the first direction, the first sidewall opposite to the second sidewall, the first sidewall of the first base fin at least partially defines a first deep trench, the second sidewall of the first base fin at least partially defines a second deep trench, and a depth of the first deep trench is greater than a depth of the second deep trench.

According to some example embodiments, there is provided a semiconductor device comprising a substrate, a first base fin and a second base fin, the first base fin and the second base fin protruding from the substrate and separated from each other in a first direction by a deep trench, a first fin type pattern protruding from the first base fin, the first fin type pattern at least partially defining a first fin trench, and a second fin type pattern protruding from the second base fin, the second fin type pattern at least partially defining a second fin trench. The deep trench includes an upper trench, and a lower trench on a bottom surface of the upper trench, and a sidewall of the first base fin and a sidewall of the second base fin define the upper trench.

According to some example embodiments, there is provided a semiconductor device comprising a substrate, a first base fin and a second base fin, the first base fin and the second base fin protruding from the substrate and separated from each other in a first direction by a first deep trench, a third base fin protruding from the substrate and separated from the second base fin in the first direction by a second deep trench, a first fin type pattern protruding from the first base fin and extending in a second direction perpendicular to the first direction, a second fin type pattern protruding from the second base fin and extending in the second direction, a third fin type pattern protruding from the third base fin and extending in the second direction, and a field insulating film which fills the first deep trench and the second deep trench, and covers a part of sidewalls of the first to third fin type patterns. The first fin type pattern is in a transistor region of a first conductive type, the second fin type pattern and the third fin type pattern are in a transistor region of a second conductive type different from the first conductive type, and a depth of the first deep trench is greater than a depth of the second deep trench.

However, example embodiments are not restricted to the one set forth herein. The above and other aspects of example embodiments will become more apparent to one of ordinary skill in the art to which example embodiments pertains by referencing the detailed description given below.

DETAILED DESCRIPTION OF EXAMPLE EMBODIMENTS

Although the drawings of a semiconductor device according to some example embodiments show a fin-type transistor (FinFET) including a channel region of a fin-type pattern shape, a transistor including a nanowire or a nanosheet, and a MBCFET™ (Multi-Bridge Channel Field Effect Transistor), example embodiments are not limited thereto. The semiconductor device according to some example embodiments may, of course, include a tunneling FET or a three-dimensional (3D) transistor. The semiconductor device according to some example embodiments may, of course, include a planar transistor. Alternatively or additionally, some features of example embodiments may be applied to a transistor (2D material based FETs) based on two-dimensional material and a heterostructure thereof.

Alternatively or additionally, the semiconductor device according to some example embodiments may also include at least one of a bipolar junction transistor, a laterally diffused metal oxide semiconductor (LDMOS), or the like.

The semiconductor device according to some example embodiments will be described referring to FIGS. 1 to 9.

Figure 1:
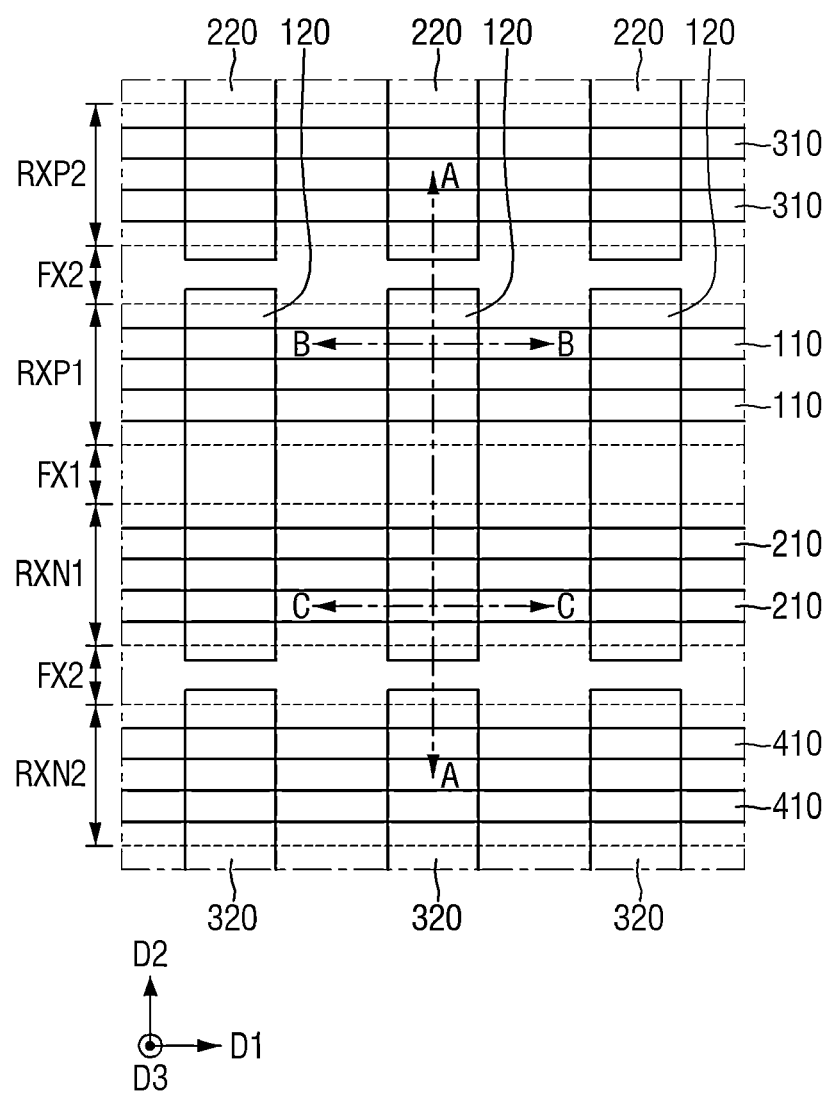
FIG. 1 is an example layout diagram for explaining a semiconductor device according to some example embodiments.
Figure 2:
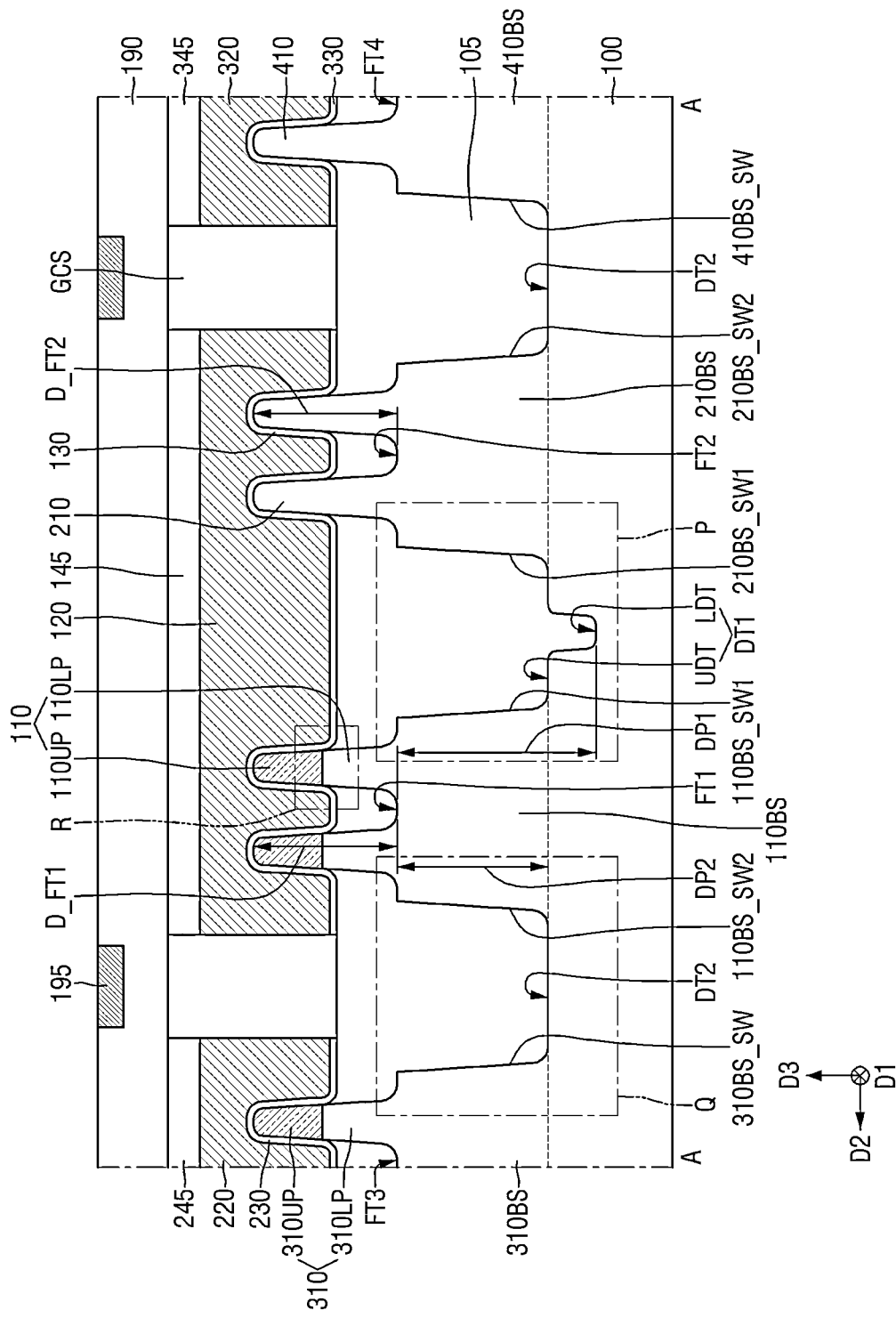
FIG. 2 is an example cross-sectional view taken along A-A of FIG. 1.
Figure 3:
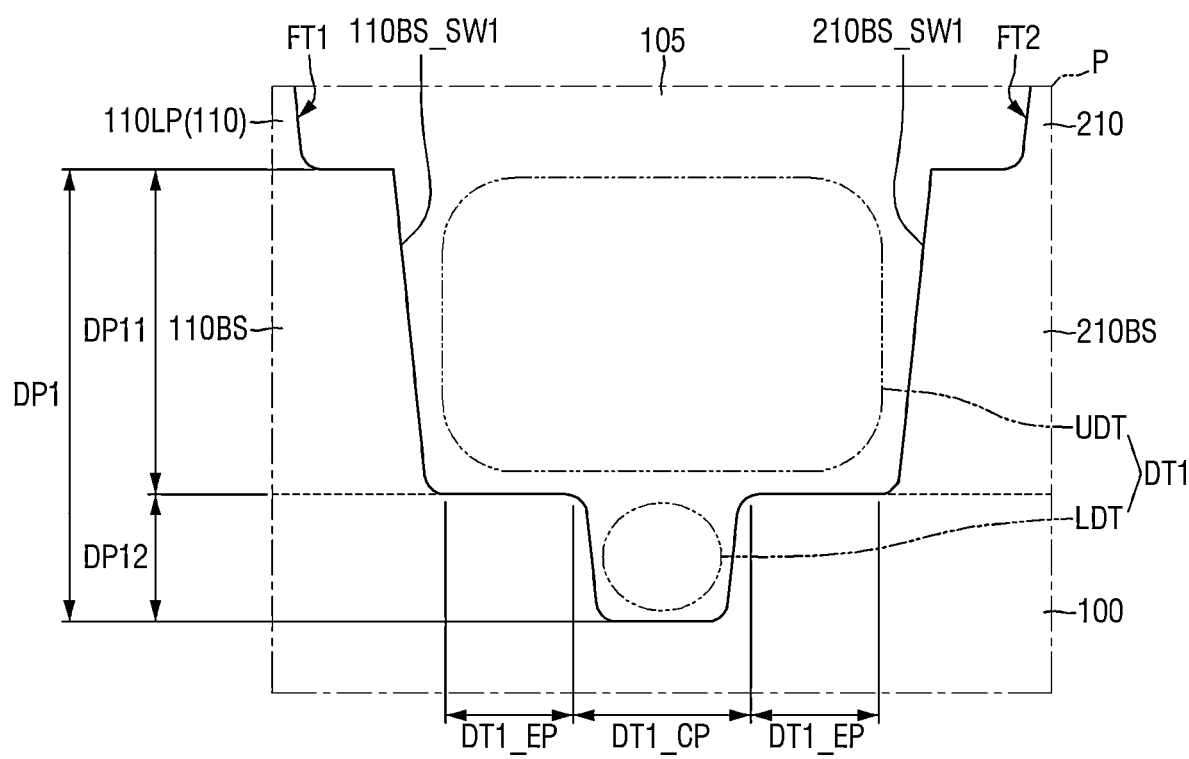
FIG. 3 is an enlarged view of a portion P of FIG. 2.
Figure 4:
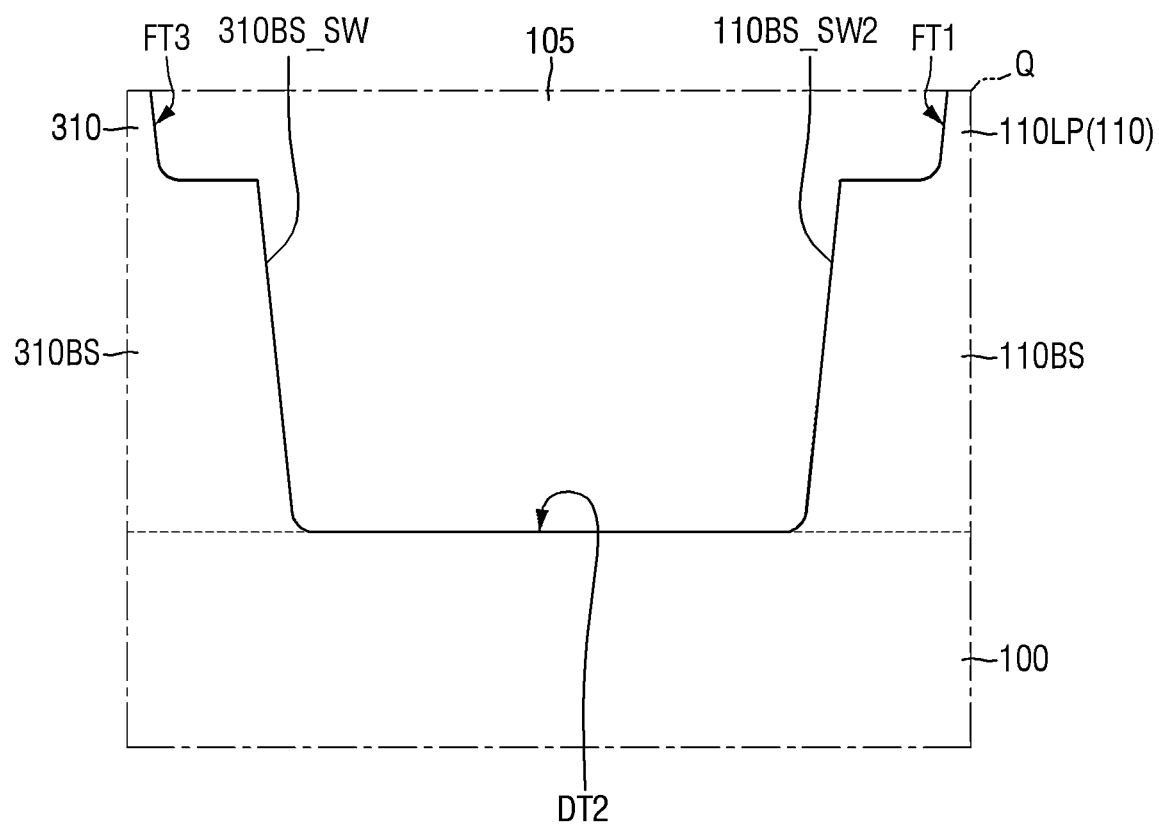
FIG. 4 is an enlarged view of a portion Q of FIG. 2.
Figure 5:
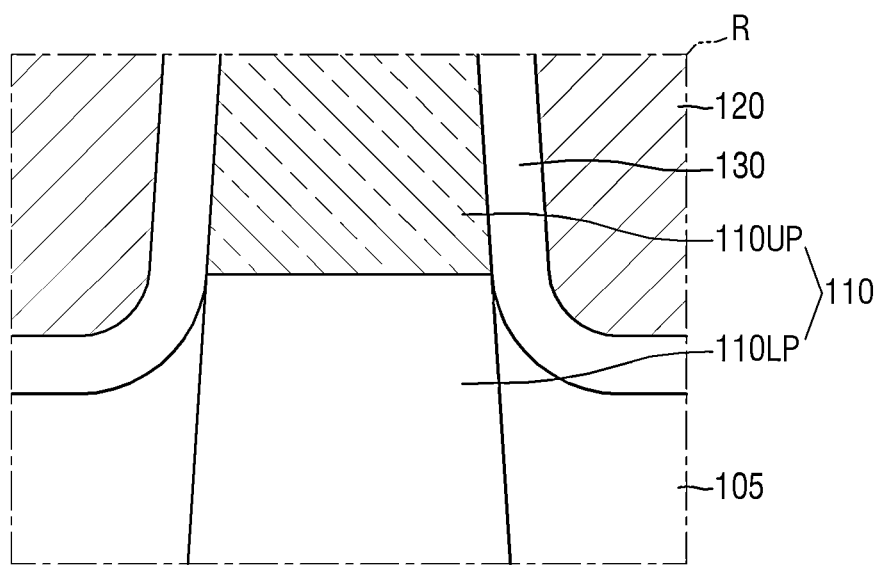
FIGS. 5 to 7 are enlarged example views showing a portion R of FIG. 2.
Figure 6:
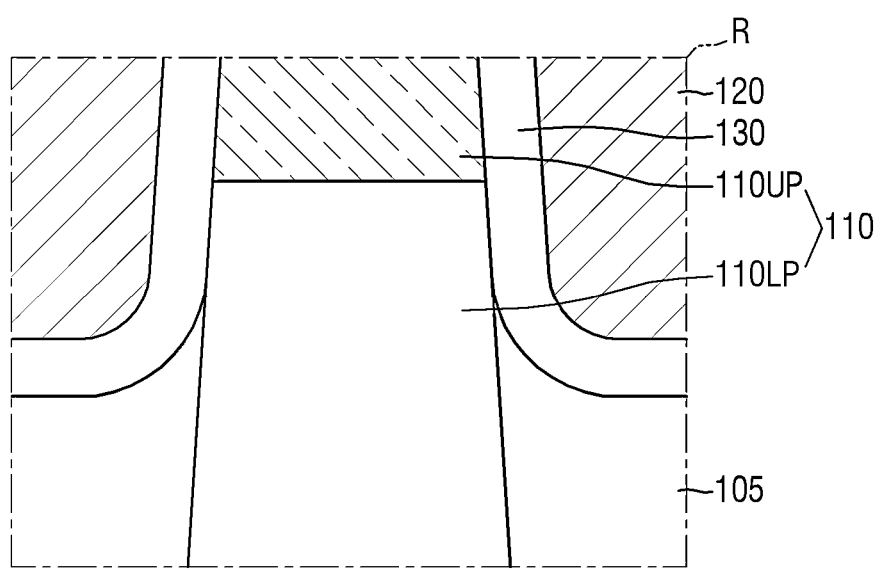
Figure 7:
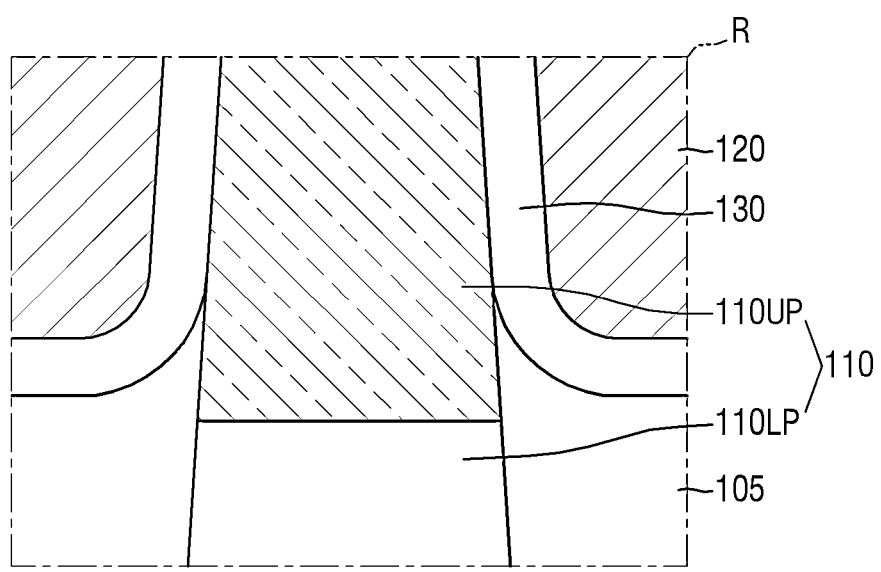
Figure 8:
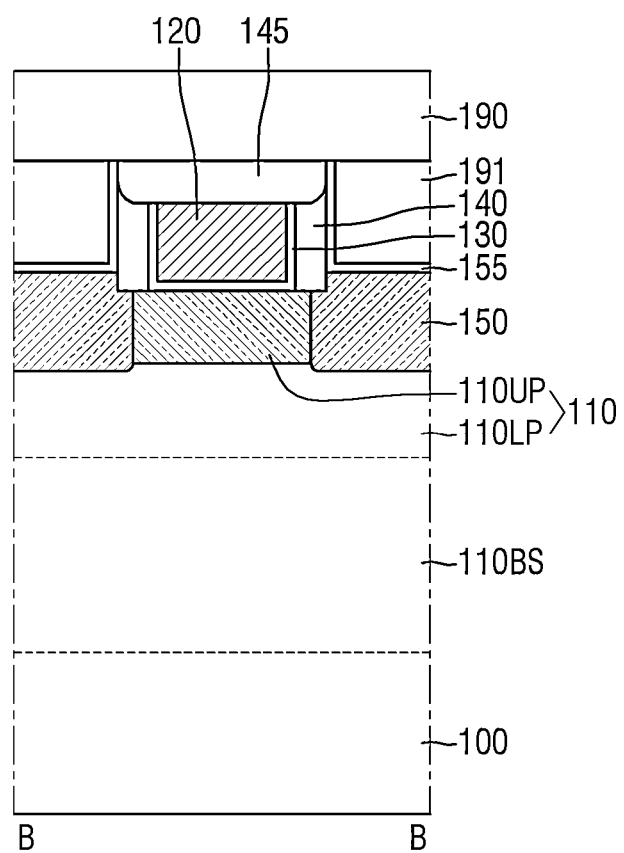
FIGS. 8 and 9 are example cross-sectional views taken along B-B and C-C of FIG. 1.
Figure 9:
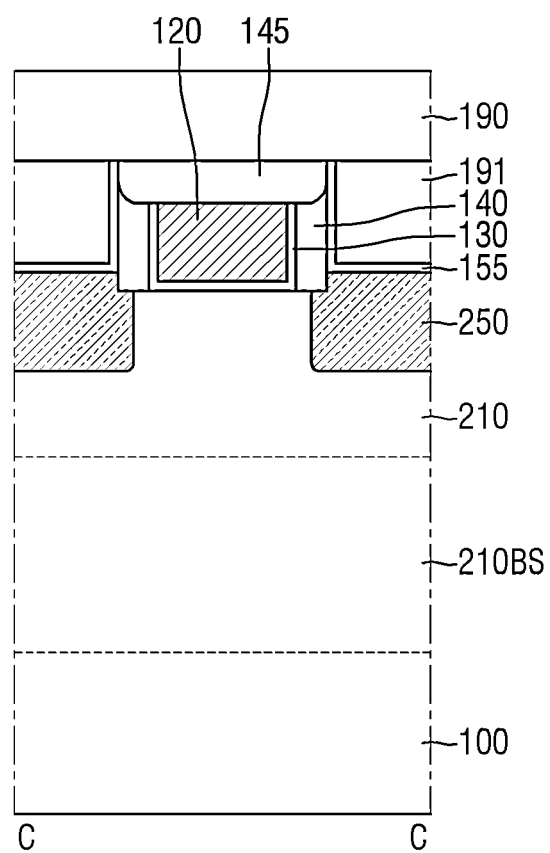

FIG. 1 is an example layout diagram for explaining a semiconductor device according to some example embodiments. FIG. 2 is an example cross-sectional view taken along A-A of FIG. 1. FIG. 3 is an enlarged view of a portion P of FIG. 2. FIG. 4 is an enlarged view of a portion Q of FIG. 2. FIGS. 5 to 7 are enlarged example views showing a portion R of FIG. 2. FIGS. 8 and 9 are example cross-sectional views taken along B-B and C-C of FIG. 1. For convenience of explanation, a wiring line 195 is not shown in FIG. 1.

Referring to FIGS. 1 to 9, the semiconductor device according to some example embodiments may include first to fourth base fins 110BS, 210BS, 310BS, and 410BS, first to fourth fin type patterns 110, 210, 310, and 410, a first deep trench DT1, a second deep trench DT2, and a plurality of gate electrodes 120, 220, and 320.

The substrate 100 may include a first p-type active region RXP1, a second p-type active region RXP2, a first n-type active region RXN1, a second n-type active region RXN2, a first field region FX1, and a second field region FX2. The first p-type active region RXP1, the second p-type active region RXP2, the first n-type active region RXN1, the second n-type active region RXN2, the first field region FX1 and the second field region FX2 may be placed in a high-voltage operating region, may be placed in a low-voltage operating region, or may be placed in a nominal-voltage operating region.

The first p-type active region RXP1 and the second p-type active region RXP2 may each be regions in which a transistor of a first conductive type is formed. For example, the first p-type active region RXP1 and the second p-type active region RXP2 may be or correspond to PMOS formation regions. Certain electrical characteristics, for example threshold voltages, of transistors formed in the first p-type active region RXP1 may be the same as, or different from, other electrical characteristics of transistors formed in the second p-type active region RXP2. The first n-type active region RXN1 and the second n-type active region RXN2 may each be regions in which a transistor of a second conductive type different from the first conductive type is formed. The first n-type active region RXN1 and the second n-type active region RXN2 may each be or correspond to an NMOS formation region. Certain electrical characteristics, for example threshold voltages, of transistors formed in the first n-type active region RXN1 may be the same as, or different from, other electrical characteristics of transistors formed in the second n-type active region RXN2.

The first field region FX1 and the second field region FX2 may be formed immediately adjacent to the first p-type active region RXP1, the second p-type active region RXP2, the first n-type active region RXN1 and the second n-type active region RXN2. The first field region FX1 may form a boundary between the PMOS formation region and the NMOS formation region. For example, the first field region FX1 is placed between transistor formation regions of different conductive types. The second field region FX2 may form a boundary with the PMOS formation region and the PMOS formation region. Alternatively or additionally, the second field region FX2 may form a boundary with the NMOS formation region and the NMOS formation region. For example, the second field region FX2 is located between the transistor formation regions of the same conductive type.

The first p-type active region RXP1, the second p-type active region RXP2, the first n-type active regions RXN1, and the second n-type active region RXN2 are spaced apart from each other. The first p-type active region RXP1 and the first n-type active region RXN1 may be separated by the first field region FX1. The first p-type active region RXP1 and the second p-type active region RXP2 may be separated by the second field region FX2. The first n-type active region RXN1 and the second n-type active region RXN2 may be separated by the second field region FX2.

For example, an element separation film may be placed around the first p-type active region RXP1, the second p-type active region RXP2, the first n-type active region RXN1, and the second n-type active region RXN2 that are spaced apart from each other. At this time, a portion of the element separation film existing or placed between the active regions RXP1, RXP2, RXN1, and RXN2 may be or correspond to field regions FX1 and FX2. For example, the portion in which a channel region of a transistor, which may be an example of the semiconductor device, is formed may be the active region, and a portion that divides the channel region of the transistor formed in the active region may be a field region. Alternatively or additionally, the active region corresponds to a portion in which a fin type pattern or nanosheet used as the channel region of the transistor is formed, and the field region may be a region in which the fin type pattern or nanosheet used as the channel region is not formed.

The substrate 100 may be or may include a silicon substrate or an SOI (silicon-on-insulator). Alternatively or additionally, the substrate 100 may include, but is not limited to, silicon germanium, SGOI (silicon germanium on insulator), indium antimonide, lead tellurium compounds, indium arsenic, indium phosphide, gallium arsenide or gallium antimonide. In the following description, the substrate 100 will be described as a silicon substrate. The substrate 100 may be a single-crystalline substrate, and may be doped (e.g. lightly doped); however, example embodiments are not limited thereto.

A first base fin 110BS and at least one or more first fin type patterns 110 may be placed in the first p-type active region RXP1. The first base fin 110BS may protrude from the substrate 100, e.g. may protrude in a third direction D3 perpendicular to a surface of the substrate 100. The first base fin 110BS may extend long along the first direction D1. The first fin type pattern 110 may protrude from the first base fin 110BS. The first fin type pattern 110 may extend long along the first direction D1. The first fin type pattern 110 may include a long side extending in the first direction D1, and a short side extending in the second direction D2. Here, the first direction D1 may intersect the second direction D2 and the third direction D3. Also, the second direction D2 may intersect the third direction D3. The third direction D3 may be a thickness direction of the substrate 100, and may be referred to as a vertical direction.

The first fin type pattern 110 may be defined by or at least partially define a first fin trench FT1 extending in the first direction D1. The first fin trench FT1 may be placed on either side of the first fin type pattern 110. Sidewalls of the first fin type pattern 110 may be defined by or at least partially define the first fin trench FT1. A depth of the first fin trench FT1 may be a first fin depth D_FT1. For example, the height of the first fin type pattern 110 may be the first fin depth D_FT1.

The first base fin 110BS may include a first sidewall 110BS_SW1, and a second sidewall 110BS_SW2 opposite to the first sidewall 110BS_SW1 of the first base fin. The first sidewall 110BS_SW1 of the first base fin and the second sidewall 110BS_SW2 of the first base fin are opposite to each other in the second direction D2. The first sidewall 110BS_SW1 of the first base fin and the second sidewall 110BS_SW2 of the first base fin each extend in the first direction D1.

The first base fin 110BS may be defined by or at least partially define a first deep trench DT1 and a second deep trench DT2 spaced apart from each other in the second direction D2. The first sidewall 110BS_SW1 of the first base fin may be defined by or at least partially define the first deep trench DT1. The second sidewall 110BS_SW2 of the first base fin may be defined or at least partially define by the second deep trench DT2.

The first fin type pattern 110 may have a composite film structure. Here, the term "composite film structure" means/ corresponds to a structure including a plurality of semiconductor material patterns formed of or having different materials from each other. The first fin type pattern 110 may include, for example, a first lower fin type pattern 110LP and a first upper fin type pattern 110UP. The first upper fin type pattern 110UP is placed on the first lower fin type pattern 110LP. The first upper fin type pattern 110UP may be directly connected to the first lower fin type pattern 110LP.

The first lower fin type pattern 110LP is connected, e.g. directly connected to the first base fin 110BS. The first lower fin type pattern 110LP may be formed of or include the same material as the first base fin 110BS. For example, the first base fin 110BS and the first lower fin type pattern 110LP may be an integral structure which has no boundary between the first base fin 110BS and the first lower fin type pattern 110LP.

The first upper fin type pattern 110UP may have a single film structure. Here, the term "single film structure" means or corresponds to a structure formed of a single semiconductor material, for example a single-crystalline semiconductor material, or a homogeneous semiconductor material.

For example, the first lower fin type pattern 110LP and the first upper fin type pattern 110UP may include different materials from each other. The first lower fin type pattern 110LP and the first base fin 110BS may be formed of silicon, e.g. of single-crystal silicon. The first upper fin type pattern 110UP may include silicon-germanium. The first fin type pattern 110 may have a composite film structure including a silicon pattern and a silicon-germanium pattern.

The first fin trench FT1, which defines the first fin type pattern 110 placed in the outermost part of the first p-type active region RXP1, and the first deep trench DT1 may be placed immediately adjacent to each other, e.g. without any intervening trenches therebetween. Alternatively or additionally, the first fin trench FT1, which defines the first fin type pattern 110 placed in the outermost part of the first p-type active region RXP1, and the second deep trench DT2 may be placed immediately adjacent to each other. Here, the meaning of immediately adjacent is a configuration in which another first fin trench FT1 is not placed between the first deep trench DT1 and the first fin trench FT1, and between the second deep trench DT2 and the first fin trench FT1.

For example, the first fin trench FT1 that defines the first fin type pattern 110 placed at the outermost part of the first p-type active region RXP1 may be connected to or directly connected to the first deep trench DT1. At a point on which the first fin trench FT1 and the first deep trench DT1 are connected, an inclination of the first sidewall 110BS_SW1 of the first base fin by the first deep trench DT1 is different from an inclination of the upper surface of the first base fin 110BS by the first fin trench FT1.

The first deep trench DT1 may define the first field region FX1. The first deep trench DT1 may be placed in the first field region FX1. The second deep trench DT2 may define the second field region FX2. The second deep trench DT2 may be placed in the second field region FX2. Description of the first deep trench DT1 and the second deep trench DT2 will be provided below using FIGS. 3 and 4.

A second base fin 210BS and at least one or more second fin type patterns 210 may be placed in the first n-type active region RXN1. The second base fin 210BS may protrude from the substrate 100. The second base fin 210BS may extend long along the first direction D1. The second fin type pattern 210 may protrude from the second base fin 210BS. The second fin type pattern 210 may extend long along the first direction D1.

The second fin type pattern 210 may be defined by the second fin trench FT2 extending in the first direction D1. The second fin trench FT2 may be placed on either side of the second fin type pattern 210. Sidewalls of the second fin type pattern 210 may be defined by the second fin trench FT2. The depth of the second fin trench FT2 may be a second fin depth D_FT2. For example, the height of the second fin type pattern 210 may be the second fin depth D_FT2.

As an example, the depth D_FT2 of the second fin trench FT2 may be the same as the depth D_FT1 of the first fin trench FT1. As another example, the depth D_FT2 of the second fin trench FT2 may be deeper than the depth D_FT1 of the first fin trench FT1. As still another example, the depth D_FT2 of the second fin trench FT2 may be shallower than the depth D_FT1 of the first fin trench FT1.

The second base fin 210BS may include a first sidewall 210BS_SW1, and a second sidewall 210BS_SW2 opposite to the first sidewall 210BS_SW1 of the second base fin. The first sidewall 210BS_SW1 of the second base fin and the second sidewall 210BS_SW2 of the second base fin are opposite to each other in the second direction D2. The first sidewall 210BS_SW1 of the second base fin faces the first sidewall 110BS_SW1 of the first base fin. The first sidewall 210BS_SW1 of the second base fin and the second sidewall 210BS_SW2 of the second base fin each extend in the first direction D1.

The second base fin 210BS may be defined by the first deep trench DT1 and the second deep trench DT2 spaced apart from each other in the second direction D2. The first sidewall 210BS_SW1 of the second base fin may be defined by the first deep trench DT1. The second sidewall 210BS_SW2 of the second base fin may be defined by the second deep trench DT2.

The second fin trench FT2, which defines the second fin type pattern 210 placed at the outermost part of the first n-type active region RXN1, and the first deep trench DT1 may be placed immediately adjacent to each other. Alternatively or additionally, the second fin trench FT2, which defines the second fin type pattern 210 placed at the outermost part of the first n-type active regions RXN1, and the second deep trench DT2 may be placed immediately adjacent to each other.

The second fin type pattern 210 may have a single film structure, e.g. may have a homogeneous single-crystal structure. The second fin type pattern 210 may be directly connected to the second base fin 210BS. The second fin type pattern 210 may be formed of the same material as the second base fin 210BS. For example, the second base fin 210BS and the second fin type pattern 210 may be an integral structure. For example, the second fin type pattern 210 may be a silicon fin type pattern such as an epitaxial silicon fin type pattern.

A third base fin 310BS and at least one or more third fin type patterns 310 may be placed in the second p-type active region RXP2. The third base fin 310BS may protrude, e.g. protrude in the third direction D3 from the substrate 100. The third fin type pattern 310 may protrude, e.g. protrude in the third direction D3 from the third base fin 310BS. The third fin type pattern 310 may include, for example, a third lower fin type pattern 310LP and a third upper fin type pattern 310UP. The third fin type pattern 310 may be defined by a third fin trench FT3 extending in the first direction Dl. The third base fin 310B S may be defined by the first deep trench DT1 and the second deep trench DT2 spaced apart from each other in the second direction D2. Sidewalls 310BS_SW of the third base fin may be defined by the first deep trench DT1 and the second deep trench DT2. The description of the third base fin 310BS and the third fin type pattern 310 may be substantially the same as the description of the first base fin 110BS and the first fin type pattern 110.

A fourth base fin 410BS and at least one or more fourth fin type patterns 410 may be placed in the second n-type active region RXN2. The fourth base fin 410BS may protrude in the third direction D3 from the substrate 100. A fourth fin type pattern 410 may protrude from the fourth base fin 410BS. The fourth fin type pattern 410 may be defined by a fourth fin trench FT4 extending in the first direction Dl. The fourth base fin 410BS may be defined by the first deep trench DT1 and the second deep trench DT2 spaced apart from each other in the second direction D2. Sidewalls 410BS_SW of the fourth base fin may be defined by the first deep trench DT1 and the second deep trench DT2. The description of the fourth base fin 410BS and the fourth fin type pattern 410 may be substantially the same as the description of the second base fin 210BS and the second fin type pattern 210.

Although the number of each of the first to fourth fin type patterns 110, 210, 310, and 410 is shown as two, this is only for convenience of explanation, and the number is not limited thereto. There may be one or more of each of the first to fourth fin type patterns 110, 210, 310, and 410.

In the semiconductor device according to some example embodiments, the first deep trench DT1 is deeper than the second deep trench DT2 on the basis of/as measured from a bottom surface of the first fin trench FT1. The depth DP1 of the first deep trench DT1 is greater than the depth DP2 of the second deep trench DT2. For example, the depth DP1 of the first deep trench DT1 may be measured on the basis of or measured from the deepest part of the bottom surface of the first deep trench DT1. Similarly, the depth DP2 of the second deep trench DT2 may be measured on the basis of or measured from the deepest part of the bottom surface of the second deep trench DT2.

The second deep trench DT2 separates the first base fin 110BS and the third base fin 310BS. The second deep trench DT2 separates the second base fin 210BS and the fourth base fin 410BS. In the semiconductor device according to some example embodiments, the bottom surface of the second deep trench DT2 may be flat as shown in FIG. 4. In other words, the depth DP2 of the second deep trench DT2 may be constant, between the second sidewall 110BS_SW2 of the first base fin and the sidewall 310BS_SW of the third base fin.

In FIG. 3, the first deep trench DT1 may include an upper trench UDT having a first width, and a lower trench LDT having a second width narrower than the first width. The lower trench LDT may be formed on the bottom surface of the upper trench UDT. For example, the sidewall of the lower trench LDT and the sidewall of the upper trench UDT are connected by the bottom surface of the upper trench UDT.

The first deep trench DT1 separates the first base fin 110BS and the second base fin 210BS. For example, the first base fin 110BS and the second base fin 210BS may be separated by the upper trench UDT. The first sidewall 110BS_SW1 of the first base fin and the first sidewall 210BS_SW1 of the second base fin may be defined by the upper trench UDT. For example, the sidewalls of the upper trench UDT may be the first sidewall 110BS_SW1 of the first base fin and the first sidewall 210BS_SW1 of the second base fin.

For example, the first sidewall 110BS_SW1 of the first base fin may be an inclined surface, e.g. inclined with respect to a direction parallel to an upper surface of the substrate 100. The lowermost part of the first sidewall 110BS_SW1 of the first base fin may be a point on which the inclination (or slope of a tangent) of the first sidewall 110BS_SW1 of the first base fin becomes zero. For example, the sidewall of the upper trench UDT and the bottom surface of the upper trench UDT may be divided from each other, on the basis of the point on which the inclination of the first sidewall 110BS_SW1 of the first base fin becomes 0. Similarly, the sidewall of the second deep trench DT2 and the bottom surface of the second deep trench DT2 may be divided from each other, on the basis of the point on which the inclination (or slope of a tangent) of the second sidewall 110BS_SW2 of the first base fin becomes 0.

In the semiconductor device according to some example embodiments, the upper trench UDT is shallower than the lower trench LDT, on the basis of or measured from the bottom surface of the first fin trench FT1. The depth DP11 of the upper trench UDT is smaller than the depth DP1 of the lower trench LDT, on the basis of or measured from the bottom surface of the first fin trench FT1. The lower trench LDT may be deeper than the upper trench UDT by a first depth difference DP12. The depth DP1 of the first deep trench DT1 may be the depth of the lower trench LDT.

The first deep trench DT1 may include a central portion DT1_CP of the first deep trench, and an edge portion DT1_EP of the first deep trench. The central portion DT1_CP of the first deep trench may be defined between the edge portions DT1_EP of the first deep trench. The lower trench LDT may be located in the central portion DT1_CP of the first deep trench.

As an example, the depth of the edge portion DT1_EP of the first deep trench may be constant, as the edge portion DT1_EP goes away from the first sidewall 110BS_SW1 of the first base fin or the first sidewall 210BS_SW1 of the second base fin. As another example, the depth of the edge portion DT1_EP of the first deep trench may decrease, as the edge portion DT1_EP goes away from the first sidewall 110BS_SW1 of the first base fin or the first sidewall 210BS_SW1 of the second base fin. As still another example, the depth of the edge portion DT1_EP of the first deep trench may decrease and then be kept constant, as the edge portion DT1_EP goes away from the first sidewall 110BS_SW1 of the first base fin or the first sidewall 210BS_SW1 of the second base fin. In FIG. 3, the depth of the edge portion DT1_EP of the first deep trench may be kept constant, as of the edge portion DT1_EP goes away from the first sidewall 110BS_SW1 of the first base fin or the first sidewall 210BS_SW1 of the second base fin.

The depth of the central portion DT1_CP of the first deep trench may increase and then decrease again, as the central portion DT1_CP goes away from the first sidewall 110BS_SW1 of the first base fin. Similarly, the depth of the central portion DT1_CP of the first deep trench may increase and then decrease again, as the central portion DT1_CP goes away from the first sidewall 210BS_SW1 of the second base fin.

The field insulating film 105 may be formed on the substrate 100. The field insulating film 105 may be formed over or on the first p-type active region RXP1, the second p-type active region RXP2, the first n-type active region RXN1, the second n-type active region RXN2, the first field region FX1, and the second field region FX2.

The field insulating film 105 may fill the first deep trench DT1 and the second deep trench DT2. The field insulating film 105 may fill some of the first to fourth fin trenches FT1, FT2, FT3, and FT4. The field insulating film 105 may be formed on a part of the sidewall of the first fin type pattern 110, a part of the sidewall of the second fin type pattern 210, a part of the sidewall of the third fin type pattern 310, and a part of the sidewall of the fourth fin type pattern 410.

The first to fourth fin type patterns 110, 210, 310, and 410 may each protrude in the third direction upward from the upper surface of the field insulating film 105. The field insulating film 105 may include, for example, an oxide film such as silicon oxide, a nitride film such as silicon nitride, an oxynitride film such as silicon oxynitride, or a combination film thereof.

In FIG. 5, the field insulating film 105 may entirely cover the sidewalls of the first lower fin type pattern 110LP. However, the field insulating film 105 does not cover the sidewalls of the first upper fin type pattern 110UP.

In FIG. 6, the field insulating film 105 covers a part of the sidewalls of the first lower fin type pattern 110LP, and does not cover the remainder of the sidewalls of the first lower fin type pattern 110LP. The first lower fin type pattern 110LP includes a portion protruding upward from the upper surface of the field insulating film 105.

In FIG. 7, the field insulating film 105 may entirely cover the sidewalls of the first lower fin type pattern 110LP. Further, the field insulating film 105 may cover a part of the sidewalls of the first upper fin type pattern 110UP.

The first to third gate electrodes 120, 220, and 320 may each extend in the second direction D2. The first to third gate electrodes 120, 220, and 320 may each be placed on the field insulating film 105.

The first gate electrode 120 may intersect the first fin type pattern 110 and the second fin type pattern 210. The second gate electrode 220 may intersect the third fin type pattern 310. The third gate electrode 320 may intersect the fourth fin type pattern 410. However, an intersection relationship between the gate electrode and the fin type pattern is only for convenience of explanation and is not limited thereto. For example, at least one of the plurality of first gate electrodes 120 arranged in the first direction D1 may be connected or directly connected to the second gate electrode 220 and/or the third gate electrode 320. Alternatively or additionally, at least one of the plurality of first gate electrodes 120 arranged in the first direction D1 may be separated into two portions. One of the first gate electrodes 120 separated into two portions intersects the first fin type pattern 110, and the other thereof may intersect the second fin type pattern 210.

The first to third gate electrodes 120, 220, and 320 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni-Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The first to third gate electrodes 120, 220, and 320 may be formed of or include the same, or different, materials from one another.

The first to third gate electrodes 120, 220, and 320 may each include a conductive metal oxide, a conductive metal oxynitride, and/or the like, respectively. Alternatively or additionally, the first to third gate electrodes 120, 220, and 320 may also include an oxidized form of the above-mentioned material.

The first gate electrode 120 and the second gate electrode 220 may be separated by a gate separation pattern GCS. The first gate electrode 120 and the third gate electrode 320 may be separated by the gate separation pattern GCS. The gate separation pattern GCS may be placed on the field insulating film 105. In the semiconductor device according to some example embodiments, the gate separation pattern GCS may not be retracted into the field insulating film 105.

The gate separation pattern GCS may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), aluminum oxide (AlO), and combinations thereof. Although each gate separation pattern GCS is shown as being a single film, example embodiments are not limited thereto.

The first gate spacer 140 may be placed on the sidewall of the first gate electrode 120. The first gate spacer 140 may extend in the second direction D2. The first gate spacer 140 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC) and combinations thereof. Although not shown, the gate spacer may also be formed on the sidewalls of the second gate electrode 220 and the third gate electrode 320.

The first gate insulating film 130 may extend along the sidewalls and bottom surface of the first gate electrode 120. The second gate insulating film 230 may extend along the sidewalls and bottom surface of the second gate electrode 220. The third gate insulating films 330 may extend along the sidewalls and bottom surface of the third gate electrode 320. The first to third gate insulating films 130, 230, and 330 may extend along the upper surface of the field insulating film 105.

Taking the first gate insulating film 130 as an example, the first gate insulating film 130 may be formed along a profile of the first fin type pattern 110 protruding upward from the field insulating film 105, a profile of the second fin type pattern 210, and the upper surface of the field insulating film 105. Although not shown, the first gate insulating film 130 may include an interface film along the profile of the first fin type pattern 110 protruding upward from the field insulating film 105, and the profile of the second fin type pattern 210. For example, the interface film may include a silicon oxide.

In the semiconductor device according to some example embodiments, each the first to third gate insulating films 130, 230, and 330 may not extend along the sidewalls of the gate separation pattern GCS. The gate separation pattern GCS may be in contact with the first to third gate electrodes 120, 220, and 320.

The first to third gate insulating films 130, 230, and 330 may include at least one of silicon oxide, silicon oxynitride, silicon nitride, or a high dielectric constant material having a higher dielectric constant than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The semiconductor device according to some example embodiments may include an NC (Negative Capacitance) FET that uses a negative capacitor. For example, each of the first to third gate insulating films 130, 230, and 330 may include a ferroelectric material film having ferroelectric properties, and also a paraelectric material film having paraelectric properties The ferroelectric material film may have a negative capacitance, and the paraelectric material film may have a positive capacitance. For example, if two or more capacitors are connected in series and the capacitance of each capacitor has a positive value, the overall capacitances of the series decrease from the capacitance of each individual capacitor. On the other hand, if at least one of the capacitances of two or more capacitors connected in series has a negative value, the overall capacitance of the series may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. Taking advantage of the increased overall capacitance value, a transistor including the ferroelectric material film may have a subthreshold swing (SS) of less than 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr) and oxygen (0).

Alternatively or additionally the ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopants contained in the ferroelectric material film may differ, depending on which type of ferroelectric material is contained in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al) and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric properties. The paraelectric material film may include at least one of, for example, a silicon oxide and a metal oxide having a high dielectric constant. The metal oxide contained in the paraelectric material film may include, but is not limited to, for example, at least one of hafnium oxide, zirconium oxide, and aluminum oxide.

The ferroelectric material film and the paraelectric material film may include the same material. The ferroelectric material film has ferroelectric properties, but the paraelectric material film may not have ferroelectric properties. For example, when the ferroelectric material film and the paraelectric material film include hafnium oxide, a crystal structure of hafnium oxide contained in the ferroelectric material film is different from a crystal structure of hafnium oxide contained in the paraelectric material film.

The ferroelectric material film may have a thickness having the ferroelectric properties. The thickness of the ferroelectric material film may be, for example, but is not limited to, 0.5 to 10 nm. Since each ferroelectric material may have a different critical thickness that exhibits the ferroelectric properties, the thickness of the ferroelectric material film may vary depending on the ferroelectric material.

As an example, each of the first to third gate insulating films 130, 230, and 330 may include one ferroelectric material film. As another example, the first to third gate insulating films 130, 230, and 330 may each include a plurality of ferroelectric material films spaced apart from each other. The first to third gate insulating films 130, 230, and 330 may each have a stacked film structure in which the plurality of ferroelectric material films and the plurality of paraelectric material films are alternately stacked.

The first to third gate capping patterns 145, 245, and 345 may be placed on the upper surfaces of the first to third gate electrodes 120, 220, and 320. Further, the first gate capping pattern 145 may be placed on the upper surface of the first gate spacer 140. Although not illustrated, the second and third gate capping patterns 245 and 345 may also have a shape similar to the first gate capping pattern 145. The first to third gate capping patterns 145, 245 and 345 may each include, for example, at least one of silicon nitride (SiN), silicon oxynitride (SiON), silicon oxide ($SiO_2$), silicon carbonitride (SiCN), silicon oxycarbonitride (SiOCN) and a combination thereof.

Unlike that illustrated, the first gate capping pattern 145 may be placed between the first gate spacers 140. In such a case, the upper surface of the first gate capping pattern 145 may be placed on the same plane as the upper surface of the first gate spacer 140. Although not illustrated, the second and third gate capping patterns 245 and 345 may also have a shape similar to the first gate capping pattern 145.

Unlike that illustrated, the first to third gate capping patterns 145, 245, and 345 may not be placed on the first to third gate electrodes 120, 220, and 320.

A first source/drain pattern 150 may be formed on the first fin type pattern 110. The first source/drain pattern 150 may be placed on either side of the first gate electrode 120. The first source/drain pattern 150 may be connected to the first upper fin type pattern 110UP. The first source/drain pattern 150 may include p-type impurities, e.g. may include an impurity such as boron.

A second source/drain pattern 250 may be formed on the second fin type pattern 210. The second source/drain pattern 250 may be placed on either side of the first gate electrode 120. The second source/drain pattern 250 may include n-type impurities, e.g. may include at least one of phosphorus or arsenic. The first source/drain pattern 150 and the second source/drain pattern 250 may each include, but are not limited to, epitaxial patterns formed through an epitaxial process such as a homogeneous or heterogeneous epitaxial process.

Although not illustrated, source/drain patterns may be formed on both sides of the second gate electrode 220 and the third gate electrode 320.

An etching stop film 155 may be placed on the sidewalls of the first gate electrode 120 and on the first and second source/drain patterns 150 and 250. The etching stop film 155 may include a material having an etching selectivity with respect to a lower interlayer insulating film 191 to be described later. The etching stop film 155 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

The lower interlayer insulating film 191 may be placed on the etching stop film 155. The lower interlayer insulating film 191 may not cover the upper surfaces of the first to third gate capping patterns 145, 245, and 345. For example, the upper surface of the lower interlayer insulating film 191 may be placed on the same plane as the upper surface of the first gate capping pattern 145.

The upper interlayer insulating film 190 may be placed on the lower interlayer insulating film 191.

The upper interlayer insulating film 190 and the lower interlayer insulating film 191 may each include, for example, at least one of silicon oxide, silicon nitride, silicon oxynitride and a low dielectric constant material. The low dielectric constant material may include, but is not limited to, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof A wiring line 205 may be placed inside the upper interlayer insulating film 190. Although the wiring line 205 is shown as being placed at a position that overlaps the second field region FX2 in the third direction D3, this is only for convenience of explanation, and example embodiments are not limited thereto. The wiring line 205 may be placed at a position that overlaps the first field region FX1 and the active regions RXP1, RXP2, RXN1, and RXN2 in the third direction D3. The wiring line 205 may include, for example, at least one of metal, metal alloy, conductive metal nitride, conductive metal carbide, conductive metal oxide, conductive semiconductor material, conductive metal silicide, and a combination thereof.

Figure 10:
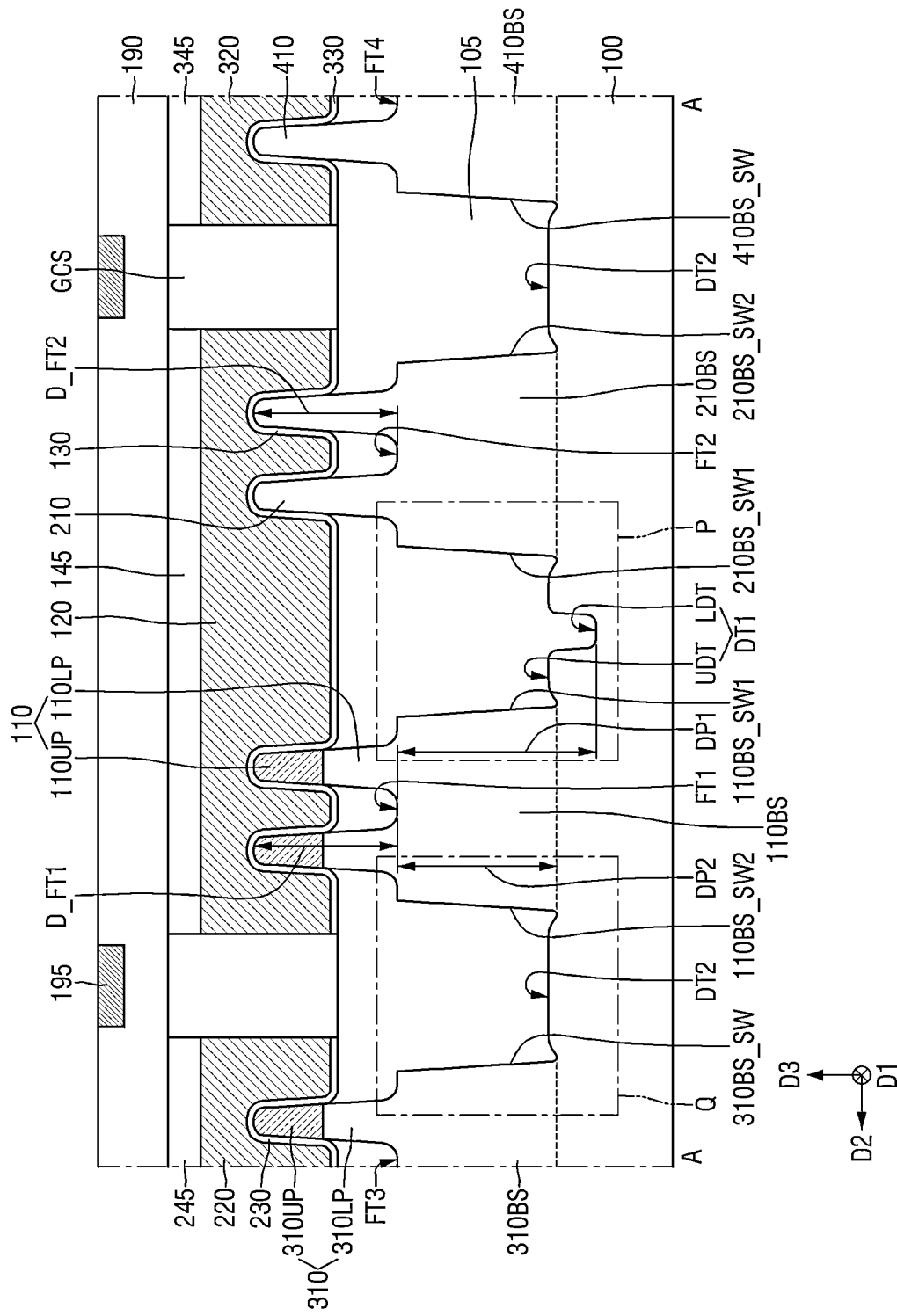
FIG. 10 is a diagram for explaining the semiconductor device according to some example embodiments.
Figure 11:
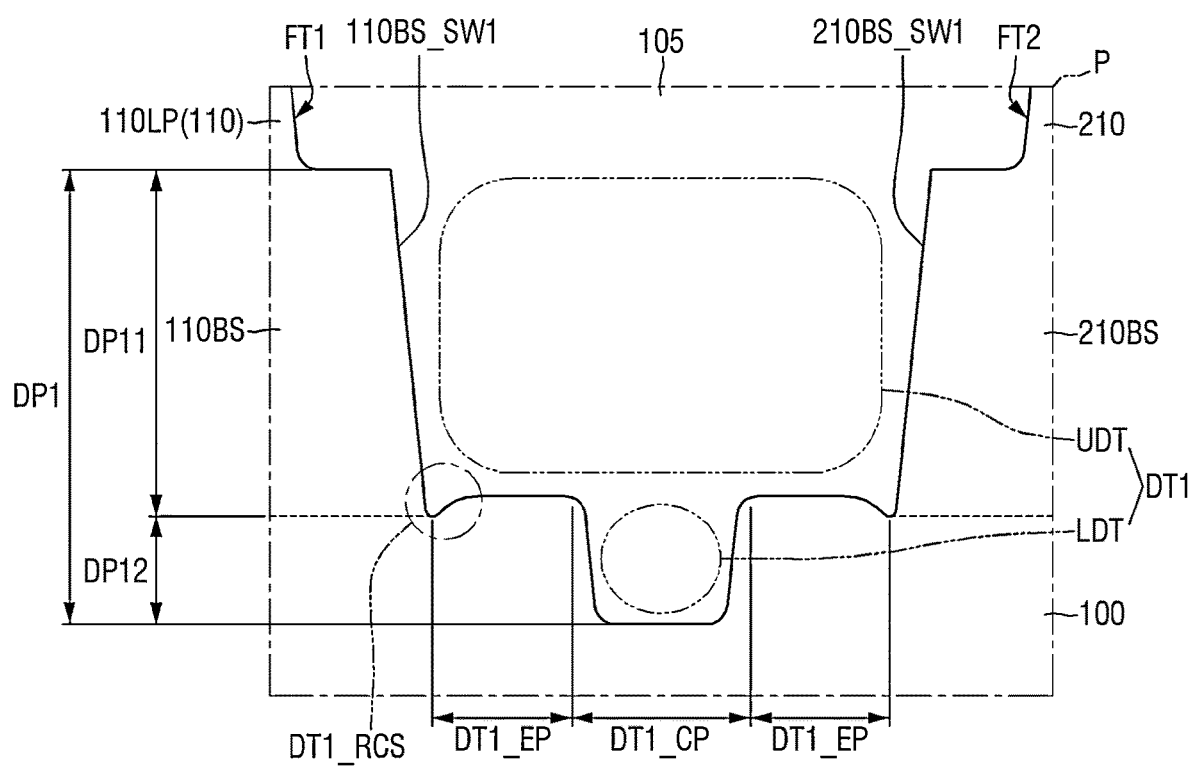
FIGS. 11 and 12 are enlarged views of a portion P and a portion Q of FIG. 10.
Figure 12:
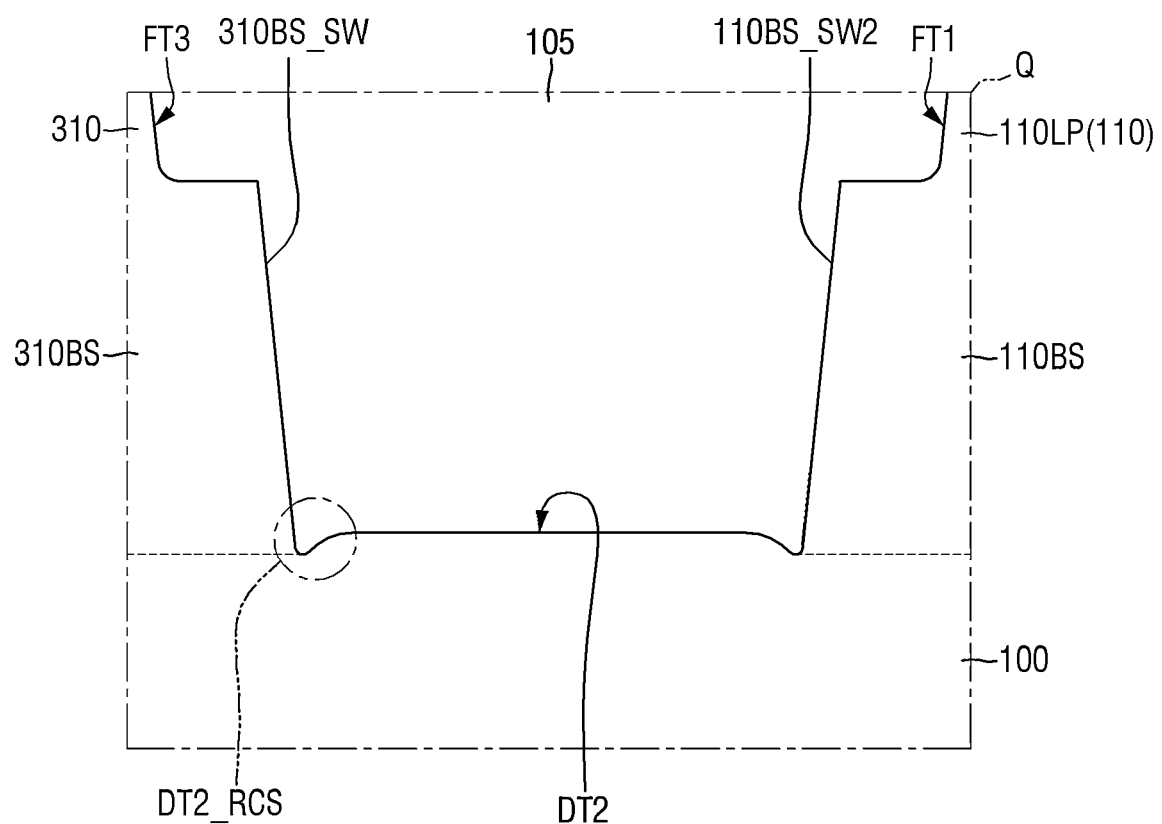

FIG. 10 is a diagram for explaining the semiconductor device according to some example embodiments. FIGS. 11 and 12 are enlarged views of a portion P and a portion Q of FIG. 10. For convenience of explanation, the points different from those described using FIGS. 1 to 9 will be mainly described.

Referring to FIGS. 10 to 12, in the semiconductor device according to some example embodiments, the upper trench UDT may further include a first bottom recess DT1_RCS formed at a point where the sidewalls of the upper trench UDT and the bottom surface of the upper trench UDT converge.

For example, the depth DP11 of the upper trench UDT may be measured on the basis of or measured from the deepest part of the first bottom recess DT1_RCS. The depth of the first bottom recess DT1_RCS may decrease, as the first bottom recess DT1_RCS goes away from the first sidewall 110BS_SW1 of the first base fin or the first sidewall 210BS_SW1 of the second base fin.

The first bottom recess DT1_RCS may be formed at an edge portion DT1_EP of the first deep trench. For example, the depth of the edge portion DT1_EP of the first deep trench may decrease and then be kept constant, as the edge portion DT1_EP goes away from the first sidewall 110BS_SW1 of the first base fin or the first sidewall 210BS_SW1 of the second base fin.

Unlike that shown, the depth of the edge portion DT1_EP of the first deep trench may decrease continuously, as the edge portion DT1_EP goes away from the first sidewall 110BS_SW1 of the first base fin or the first sidewall 210BS_SW1 of the second base fin.

The second deep trench DT2 may further include a second bottom recess DT2_RCS formed at a point where the sidewalls of the second deep trench DT2 and the bottom surface of the second deep trench DT2 converge.

For example, the depth DP2 of the second deep trench DT2 may be measured on the basis of the deepest part of the second bottom recess DT2_RCS.

The depth of the second bottom recess DT2_RCS may decrease, as the second bottom recess DT2_RCS goes away from the second sidewall 110BS_SW2 of the first base fin or the sidewall 310BS_SW of the third base fin.

For example, as the second deep trench DT2 goes away from the second sidewall 110BS_SW2 of the first base fin, the depth of the second deep trench DT2 may decrease, be kept constant, and then increase again. Unlike that shown, the depth of the second deep trench DT2 may decrease and then increase again, as the second deep trench DT2 goes away from the second sidewall 110BS_SW2 of the first base fin.

In FIG. 10, the depth DP11 of the upper trench UDT may be, but is not limited to, the same as the depth DP2 of the second deep trench DT2.

Figure 13:
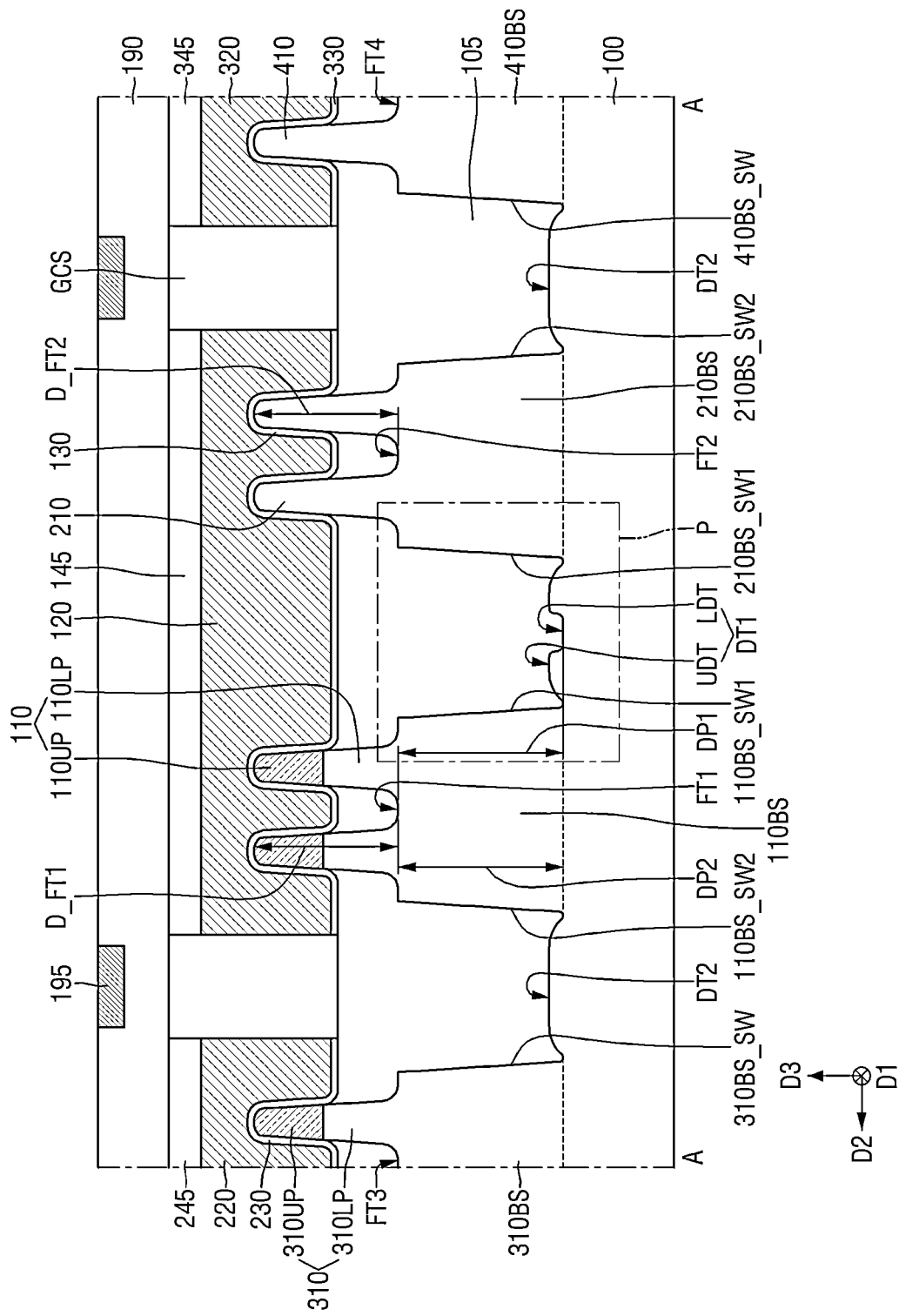
FIG. 13 is a diagram for explaining the semiconductor device according to some example embodiments.
Figure 14:
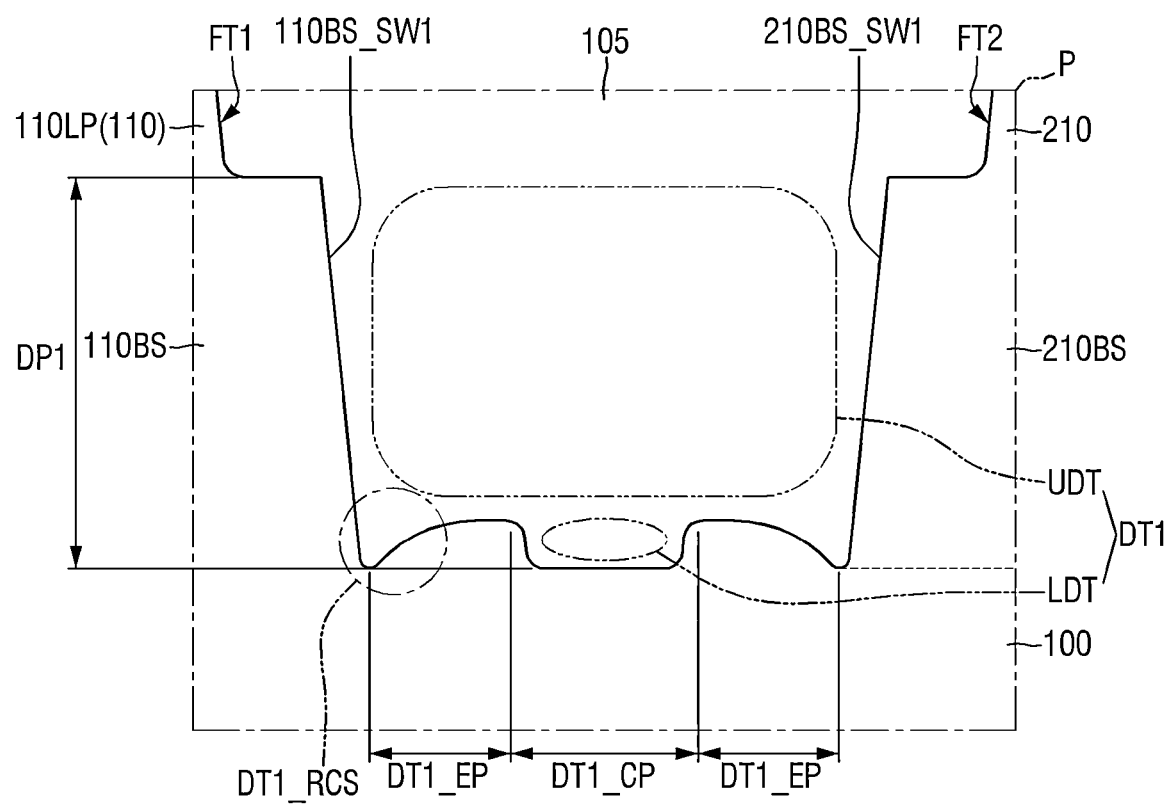
FIGS. 14 and 15 are each enlarged views of a portion P of FIG. 13.
Figure 15:
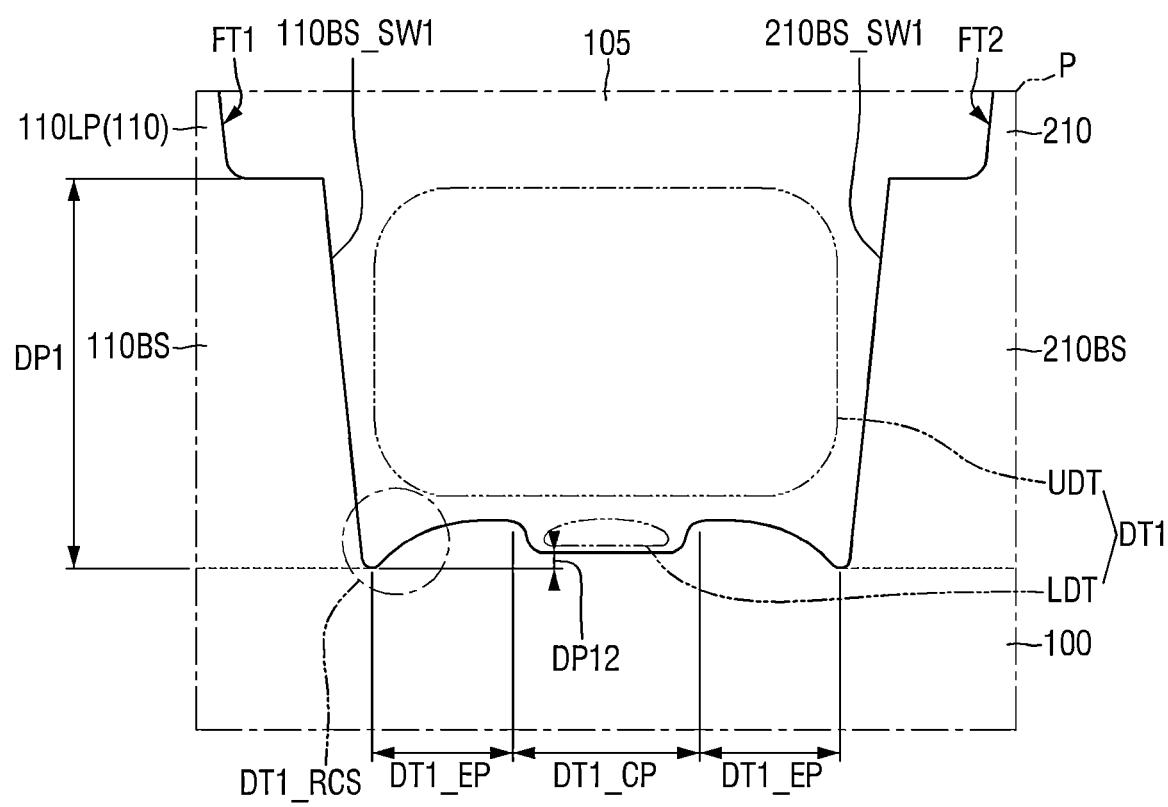

FIG. 13 is a diagram for explaining the semiconductor device according to some example embodiments. FIGS. 14 and 15 are each enlarged views of a portion P of FIG. 13. For convenience of explanation, the points different from those described using FIGS. 10 to 12 will be mainly described.

Referring to FIGS. 13 to 15, in the semiconductor device according to some example embodiments, the depth DP1 of the first deep trench DT1 may be the same as the depth DP2 of the second deep trench DT2, on the basis of the bottom surface of the first fin trench FT1.

For example, the depth DP11 of the upper trench UDT may be the same as the depth DP2 of the second deep trench DT2.

In FIG. 14, the depth of the upper trench UDT may be the same as the depth of the lower trench LDT. For example, the depth to the lowermost part of the first bottom recess DT1_RCS may be the same as the depth to the lowermost part of the lower trench LDT, on the basis of the bottom surface of the first fin trench FT1.

In FIG. 15, the depth of the upper trench UDT may be greater than the depth of the lower trench LDT. The upper trench UDT may be deeper than the lower trench LDT by a first depth difference DP12. For example, the depth to the lowermost part of the first bottom recess DT1_RCS may be greater than the depth to the lowermost part of the lower trench LDT, on the basis of the bottom surface of the first fin trench FT1. The depth DP1 of the first deep trench DT1 may be the depth of the upper trench UDT.

Figure 16:
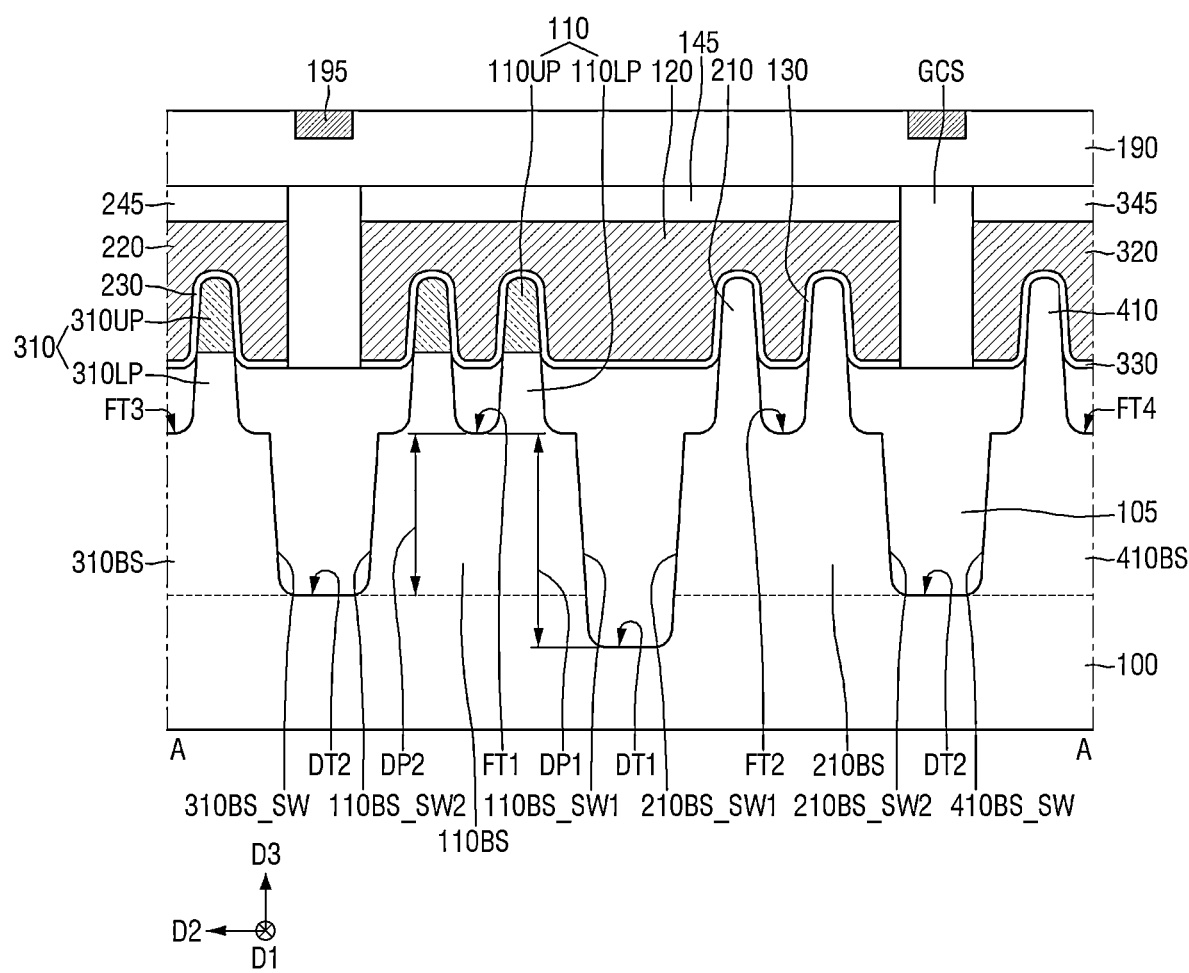
FIG. 16 is a diagram for explaining the semiconductor device according to some example embodiments.
Figure 17A:
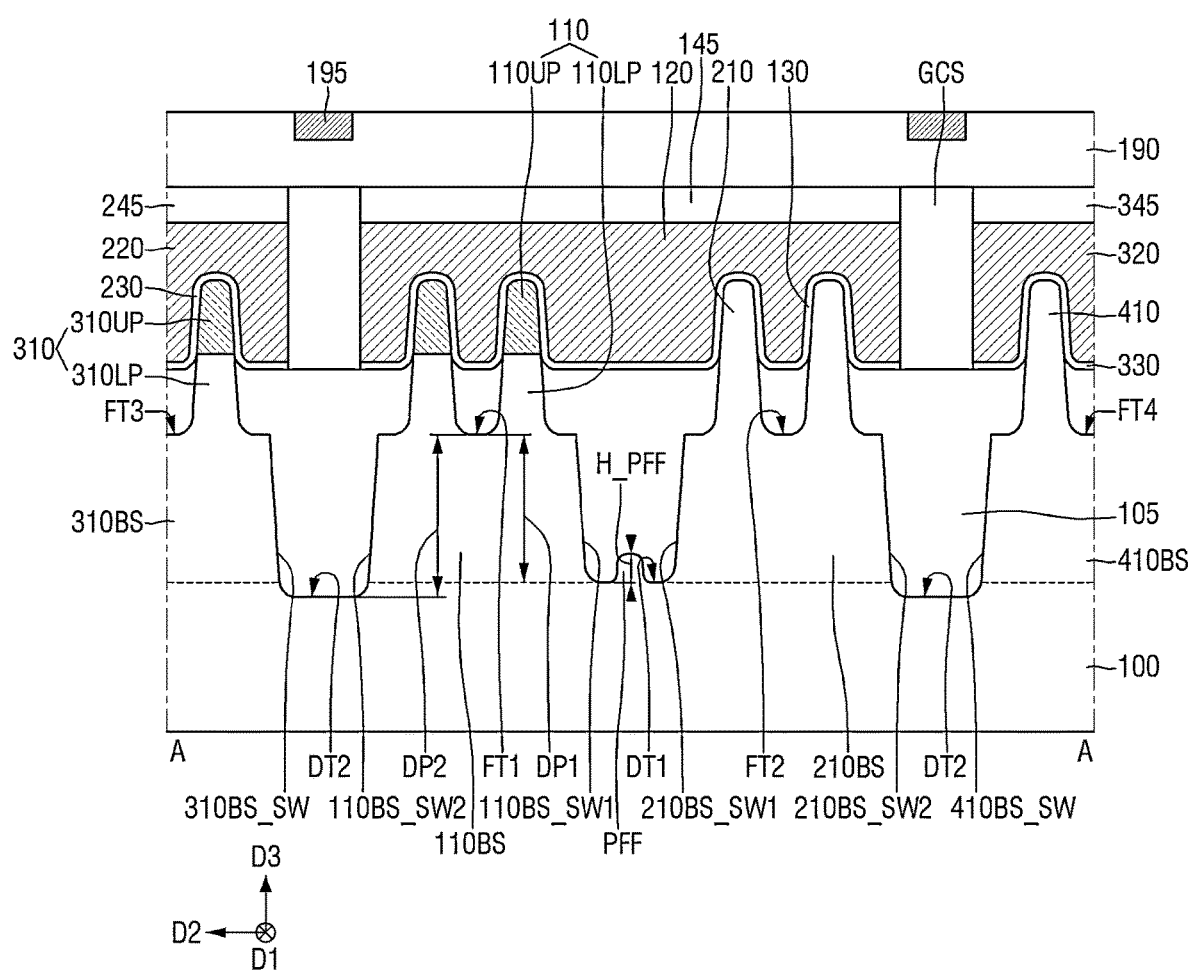
FIGS. 17A and 17B are diagrams for explaining a semiconductor device according to some example embodiments, respectively.
Figure 17B:
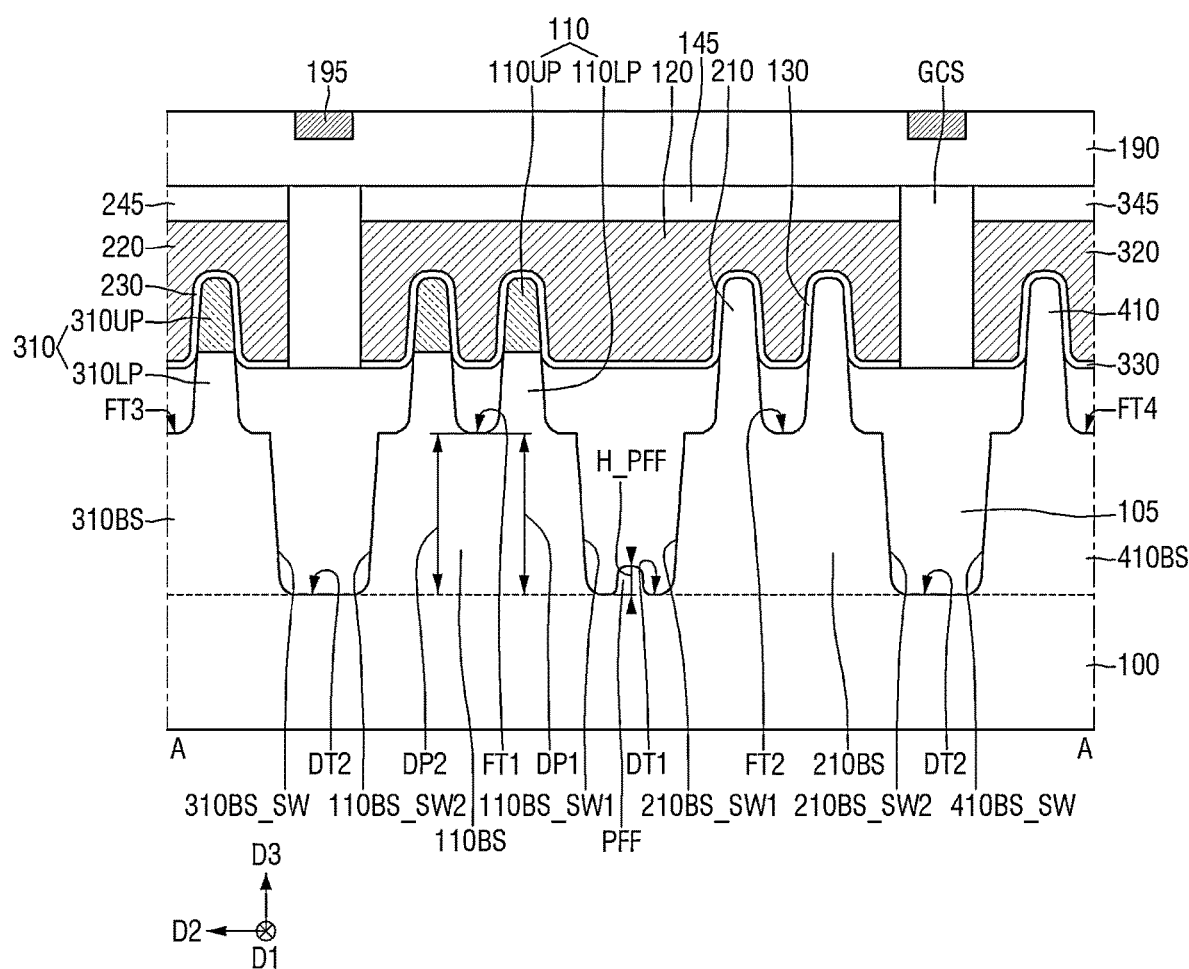

FIG. 16 is a diagram for explaining the semiconductor device according to some example embodiments. FIGS. 17A and 17B are diagrams for explaining a semiconductor device according to some example embodiments, respectively. For convenience of explanation, the points different from those described using FIGS. 1 to 9 will be mainly described.

Referring to FIG. 16, in the semiconductor device according to some example embodiments, the first to fourth base fins 110BS, 210BS, 310BS, and 410BS may be defined as portions that protrude upward from the bottom surface of the second deep trench DT2.

The depth DP2 of the second deep trench DT2 may be a height of the first to fourth base fins 110BS, 210BS, 310BS, and 410BS.

A part of the first deep trench DT1 defines the first sidewall 110BS_SW1 of the first base fin. The width of the first deep trench DT1 in the second direction D2 decreases continuously, as the first deep trench DT1 goes away from the upper surface of the field insulating film 105.

Referring to FIGS. 17A and 17B, the semiconductor device according to some example embodiments further includes a protrusion pattern PFF placed inside the first deep trench DT1.

The protrusion pattern PFF may protrude from the bottom surface of the first deep trench DT1. The bottom surface of the first deep trench DT1 may be defined by the substrate 100. The protrusion pattern PFF may protrude from the substrate 100.

In FIG. 17A, the depth DP1 of the first deep trench DT1 is smaller than the depth DP2 of the second deep trench DT2, on the basis of the bottom surface of the first fin trench FT1.

The first to fourth base fins 110BS, 210BS, 310BS, and 410BS may be defined as portions that protrude upward from the bottom surface of the first deep trench DT1. The depth DP1 of the first deep trench DT1 may be the height of the first to fourth base fins 110BS, 210BS, 310BS, and 410BS.

In FIG. 17B, the depth DP1 of the first deep trench DT1 may be substantially the same as the depth DP2 of the second deep trench DT2, on the basis of/measured from the bottom surface of the first fin trench FT1.

A height H_PFF of the protrusion pattern PFF is smaller than the height DP1 of the first base fin 110BS.

Figure 18:
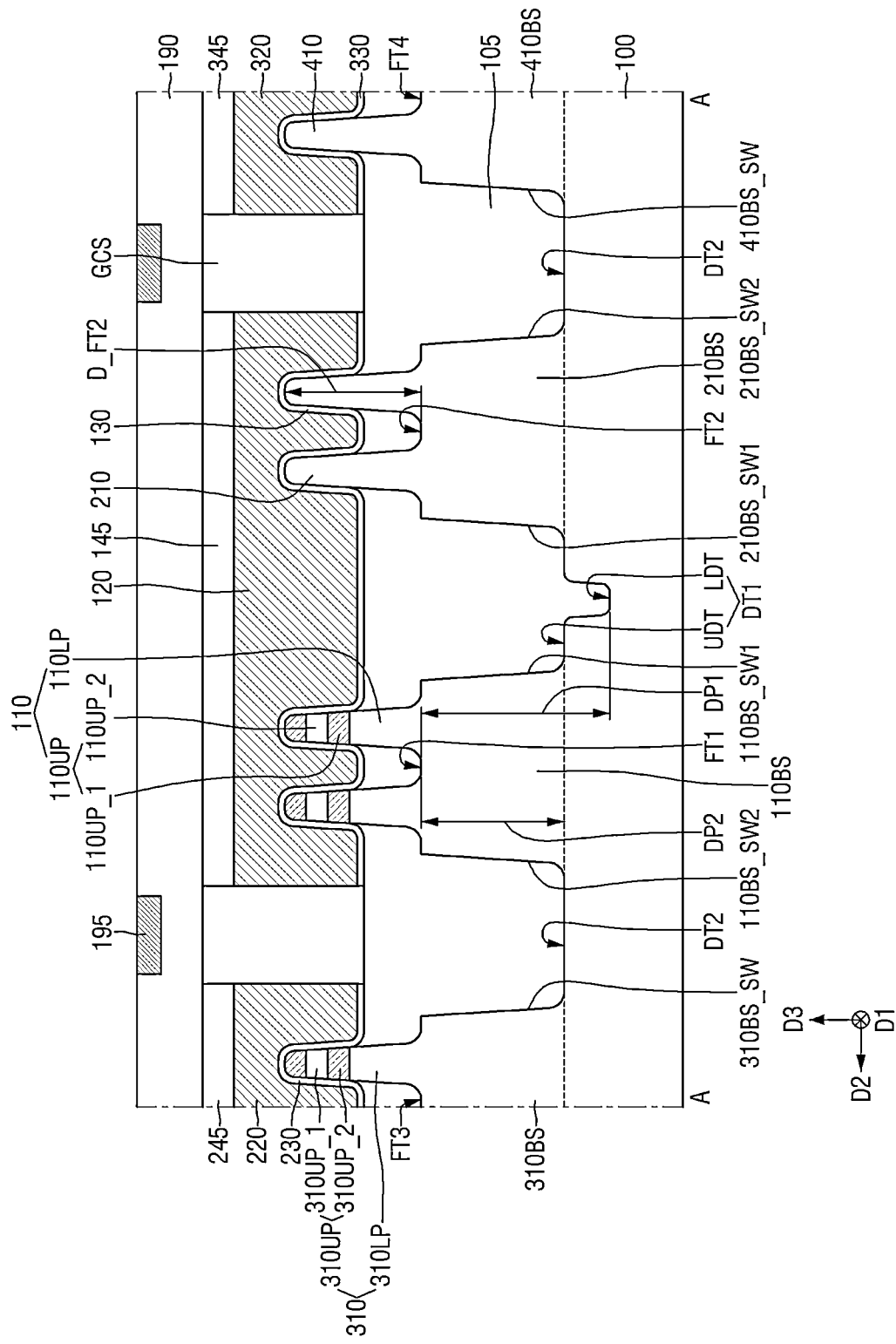
FIG. 18 is a diagram for explaining the semiconductor device according to some example embodiments.
Figure 19:
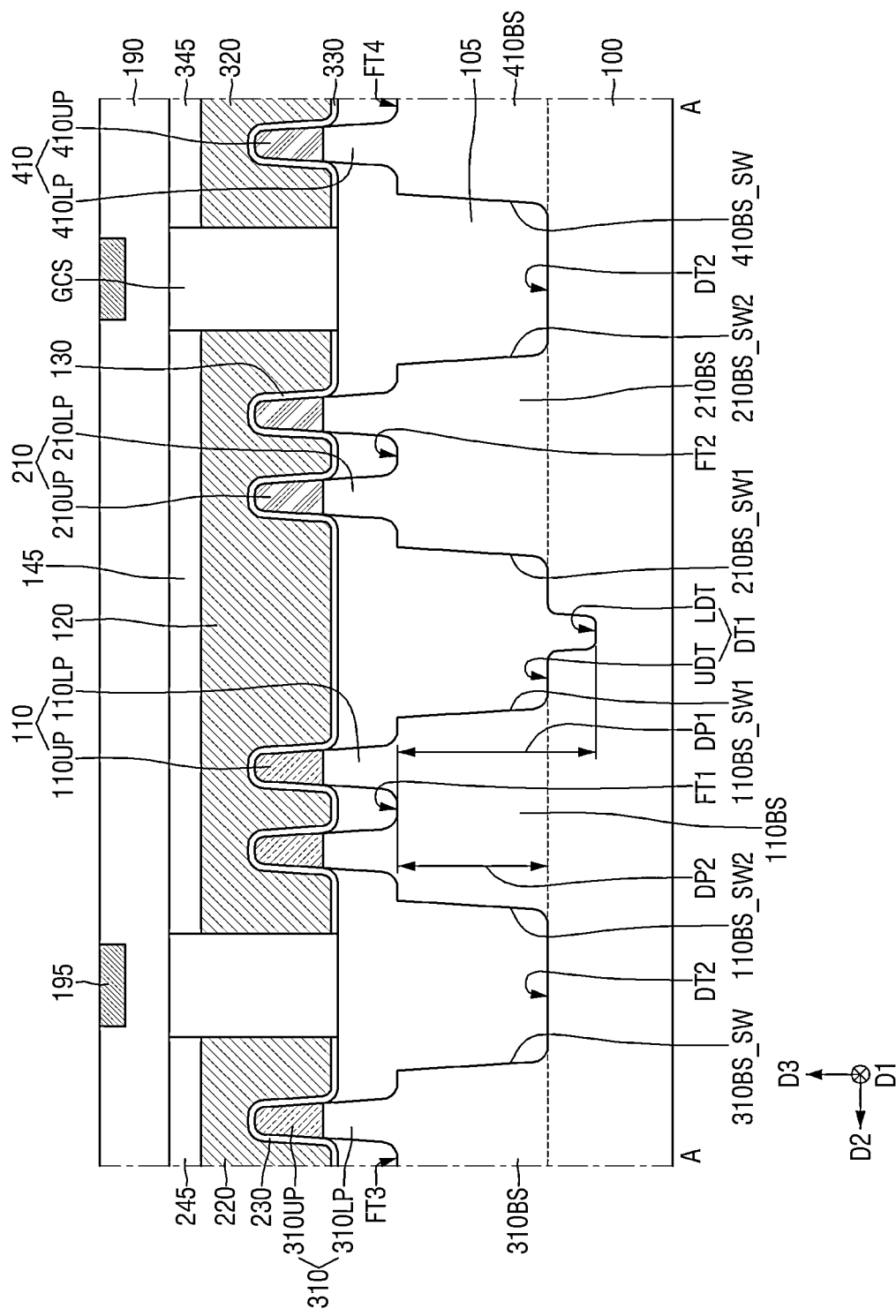
FIG. 19 is a diagram for explaining a semiconductor device according to some example embodiments.
Figure 20:
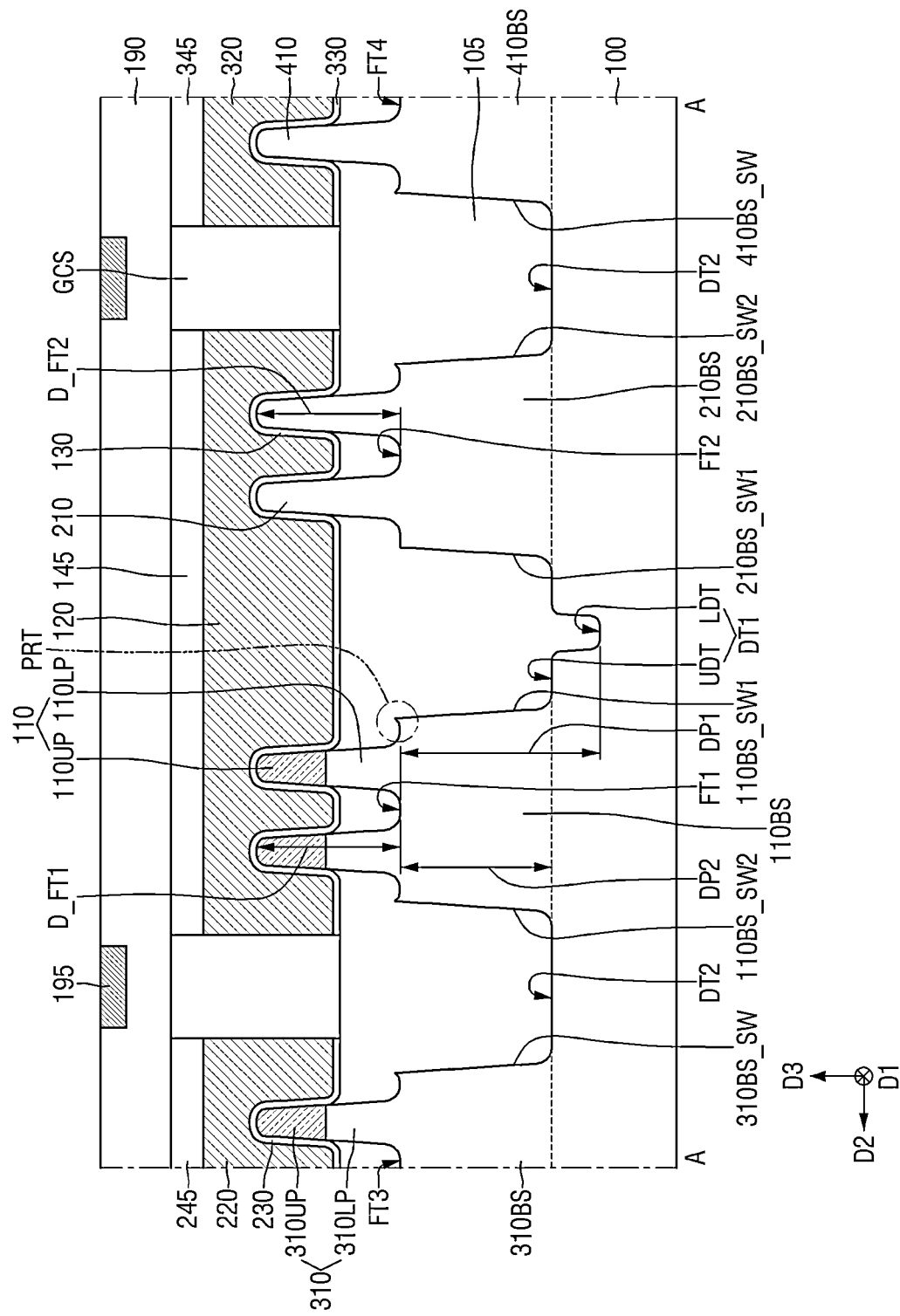
FIG. 20 is a diagram for explaining a semiconductor device according to some example embodiments.
Figure 21:
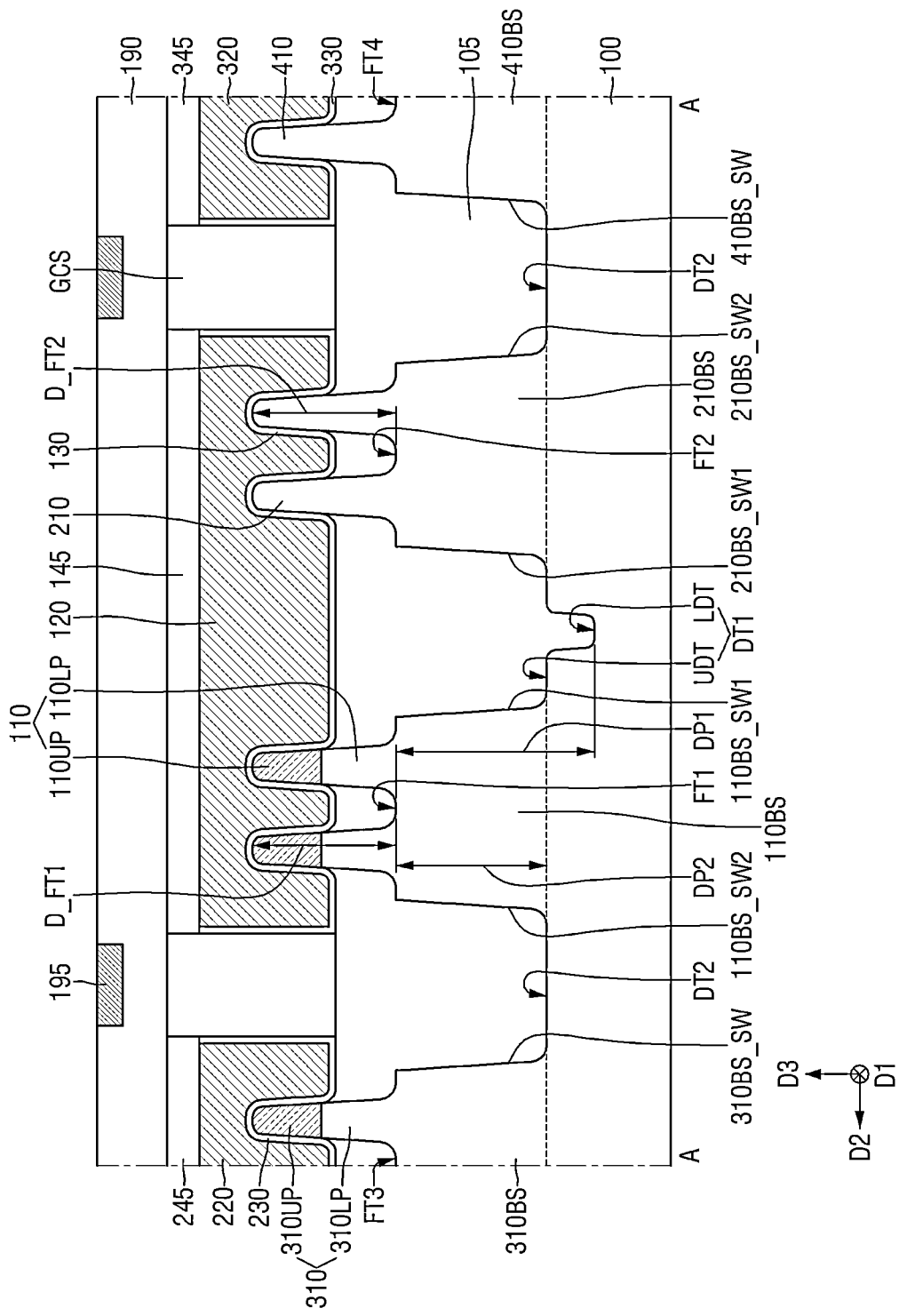
FIG. 21 is a diagram for explaining a semiconductor device according to some example embodiments.
Figure 22A:
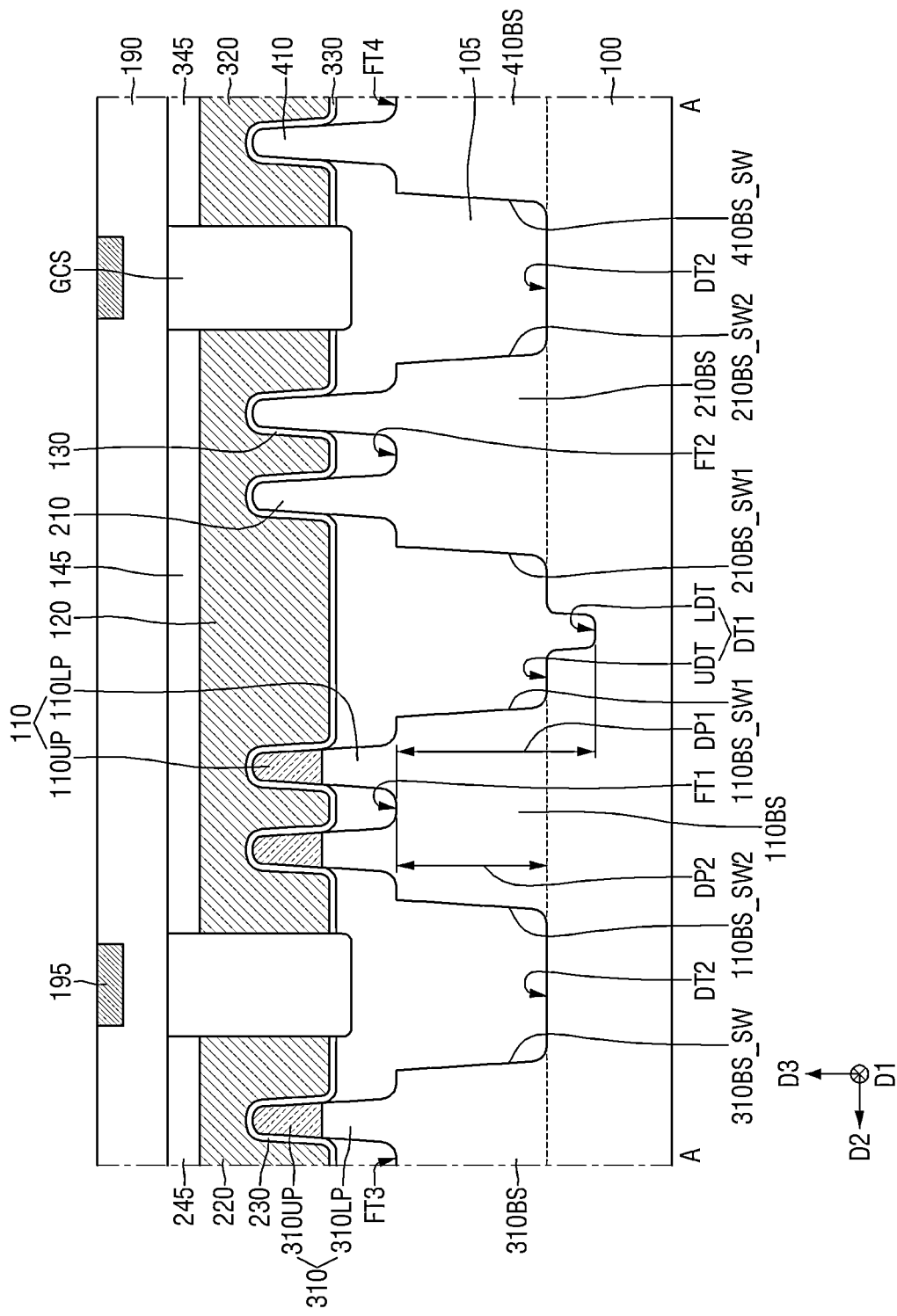
FIGS. 22A and 22B are diagrams for explaining a semiconductor device according to some example embodiments, respectively.
Figure 22B:
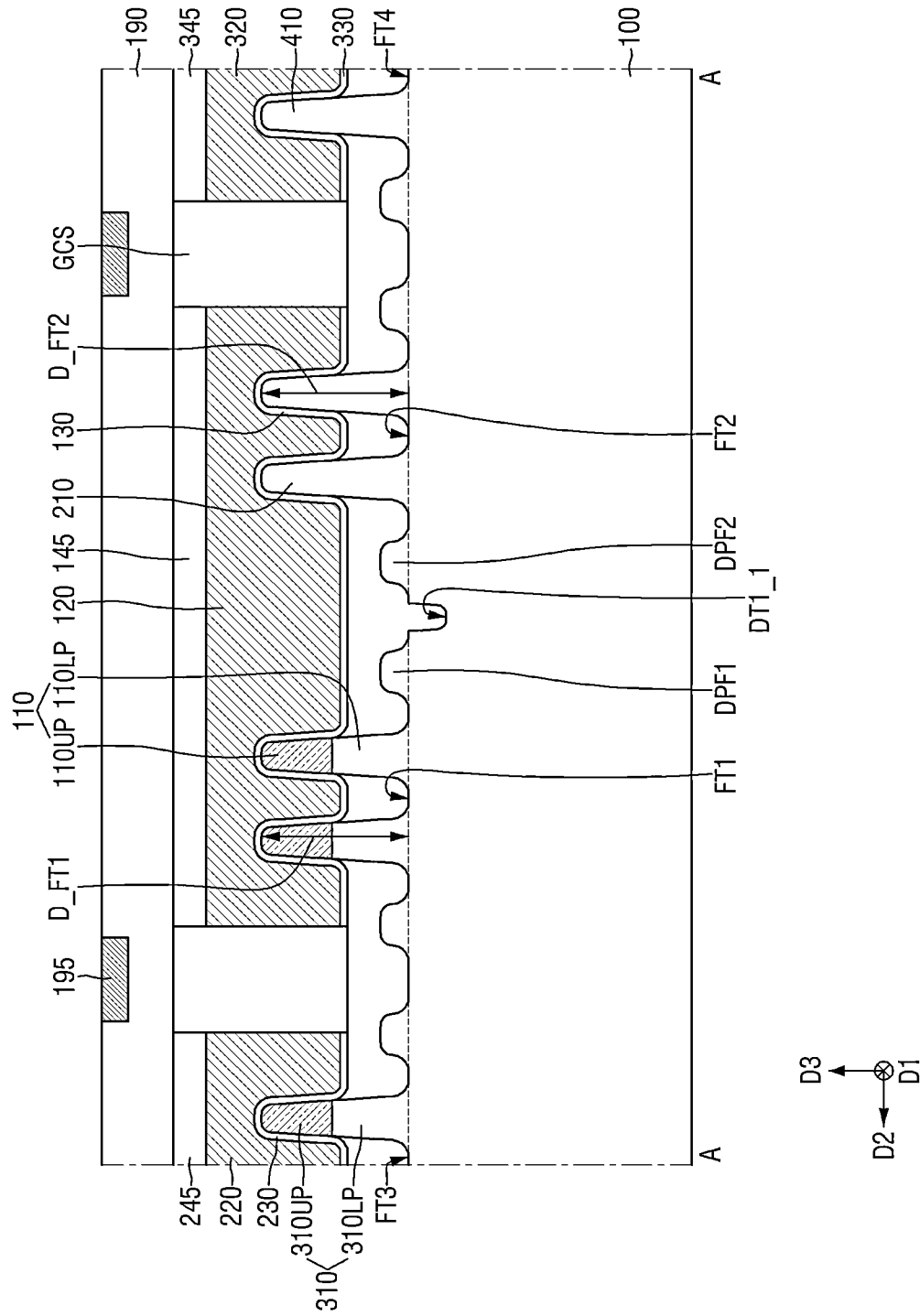

FIG. 18 is a diagram for explaining the semiconductor device according to some example embodiments. FIG. 19 is a diagram for explaining a semiconductor device according to some example embodiments. FIG. 20 is a diagram for explaining a semiconductor device according to some example embodiments. FIG. 21 is a diagram for explaining a semiconductor device according to some example embodiments. FIGS. 22A and 22B are diagrams for explaining a semiconductor device according to some example embodiments, respectively. For convenience of explanation, the points different from those described using FIGS. 1 to 9 will be mainly described.

Referring to FIG. 18, in the semiconductor device according to some example embodiments, the first upper fin type pattern 110UP and the third upper fin type pattern 310UP may each have a composite film structure.

The first upper fin type pattern 110UP may include a first_1 upper fin type pattern 110UP_1 and a first_2 upper fin type pattern 110UP_2 that are sequentially placed on the first lower fin type pattern 110LP. The lowermost first_1 upper fin type pattern 110UP_1 may be directly connected to the first lower fin type pattern 110LP. The first_2 upper fin type pattern 110UP_2 may be directly connected to the first_1 upper fin type pattern 110UP_1.

The first_1 upper fin type pattern 110UP_1 and the first_2 upper fin type pattern 110UP_2 may be formed of different materials from each other. For example, the first_1 upper fin type pattern 110UP_1 may be formed of or include silicon-germanium. The first_2 upper fin type pattern 110UP_2 may be formed of or include the same material as that of the first lower fin type pattern 110LP. For example, the first_2 upper fin type pattern 110UP_2 may be made of or include silicon.

A third upper fin type pattern 310UP may include a third_1 upper fin type pattern 310UP_1 and a third_2 upper fin type pattern 310UP_2 that are sequentially placed on the third lower fin type pattern 310LP. The description of the third upper fin type pattern 310UP may be substantially the same as the description of the first upper fin type pattern 110UP.

Although the first upper fin type pattern 110UP is shown as including a plurality of first_1 upper fin type patterns 110UP_1, and a single first_2 upper fin type pattern 110UP_2, example embodiments are not limited thereto.

As an example, unlike that illustrated, the first upper fin type pattern 110UP may include a single first_1 upper fin type pattern 110UP_1, and a single first_2 upper fin type pattern 110UP_2.

As another example, unlike that illustrated, the first upper fin type pattern 110UP may include a plurality of first_1 upper fin type patterns 110UP_1, and a plurality of first_2 upper fin type patterns 110UP_2.

Referring to FIG. 19, in the semiconductor device according to some example embodiments, the second fin type pattern 210 and the fourth fin type pattern 410 may each have a composite film structure.

The second fin type pattern 210 may include, for example, a second lower fin type pattern 210LP and a second upper fin type pattern 210UP. The second upper fin type pattern 210UP is placed on the second lower fin type pattern 210LP. The second upper fin type pattern 210UP may be directly connected to the second lower fin type pattern 210LP. The second lower fin type pattern 210LP is connected, e.g. directly connected to the second base fin 210BS. The second lower fin type pattern 210LP may be formed of or include the same material as that of the second base fin 210BS.

For example, the second lower fin type pattern 210LP and the second upper fin type pattern 210UP include different materials from each other, and may not include any common material. The second lower fin type pattern 210LP and the second base fin 210BS may be formed of silicon. The second upper fin type pattern 210UP may include a semiconductor material having electron mobility greater than that of silicon.

The fourth fin type pattern 410 may include, for example, a fourth lower fin type pattern 410LP and a fourth upper fin type pattern 410UP. The description of the fourth fin type pattern 410 may be substantially the same as the description of the second fin type pattern 210.

Referring to FIG. 20, the semiconductor device according to some example embodiments may further include a protrusion structure PRT.

For example, the protrusion structure PRT may be formed to protrude from the bottom of the first fin trench FT1, and formed to be lower than the upper surface of the field insulating film 105. The protrusion structure PRT may be located at a boundary between the first fin trench FT1 and the first deep trench DT1. The protrusion structure PRT may be located at a boundary between the first fin trench FT1 and the second deep trench DT2. Although the protrusion structure PRT is shown as being formed at both boundaries of the first p-type active region RXP1, example embodiments are not limited thereto. The protrusion structure PRT may also be formed at only one boundary of the first p-type active region RXP1.

The protrusion structure PRT may be located at the boundary between the fin trenches FT1, FT2, FT3, and FT4 and the deep trenches DT1 and DT2. One sidewall of the protrusion structure PRT may be defined by fin trenches FT1, FT2, FT3, and FT4, and the other sidewall of the protrusion structure PRT may be defined by deep trenches DT1 and DT2. The protrusion structure PRT may be located at the boundary of the active regions RXP1, RXP2, RXN1, and RXN2.

Referring to FIG. 21, the first to third gate insulating films 130, 230, and 330 may each extend along the sidewalls of the gate separation pattern GCS.

The gate separation pattern GCS may not be in contact with the first to third gate electrodes 120, 220, and 320.

Referring to FIG. 22A, in the semiconductor devices according to some example embodiments, a part of the gate separation pattern GCS may be inserted into the field insulating film 105.

Referring to FIG. 22B, the semiconductor device according to some example embodiments may further include a first dummy fin type pattern DPF1 and a second dummy fin type pattern DPF2 placed in the field regions FX1 and FX2.

Each of the first field region FX1 and the second field region FX1 may be regions in which the first dummy fin type pattern DPF1 and the second dummy fin type pattern DPF2 are placed. For example, the first field region FX1 and the second field region FX1 are not defined by the first deep trench DT1 and the second deep trench DT2 described above.

A first_1 deep trench DT1_1 deeper than the first fin trench FT1 and the second fin trench FT2 may be formed in the first field region FX1. The first_1 deep trench DT1_1 is not formed in the second field region FX2. The first_1 deep trench DT1_1, which is deeper than the first fin trench FT1 and the second fin trench FT2, is placed in the first field region FX1, but is not placed in the second field region FX2.

Although two dummy fin type patterns DPF1 and DPF2 are shown as being placed in the first field region FX1 and the second field region FX1, this is only for convenience of explanation, and example embodiments are not limited thereto. For example, one or more dummy fin type patterns may be placed in the field regions FX1 and FX2 between the adjacent active regions RXP1, RXP2, RXN1, and RXN2.

As an example, unlike that illustrated, the first_1 deep trench DT2_1 may be immediately adjacent to the first fin type pattern 110. For example, the first dummy fin type pattern DPF1 may not be placed between the first_1 deep trench DT2_1 and the first fin type pattern 110.

As another example, unlike that illustrated, the first_1 deep trench DT1_1 may be immediately adjacent to the second fin type pattern 210. For example, the second dummy fin type pattern DPF2 may not be placed between the first_1 deep trench DT1_1 and the second fin type pattern 210.

Figure 23:
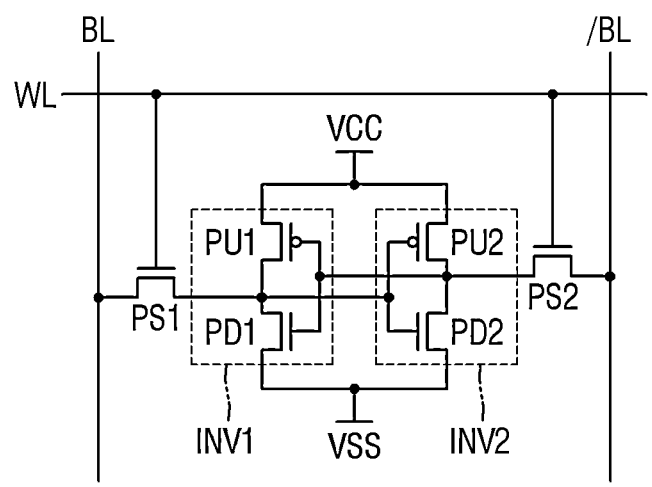
FIG. 23 is a circuit diagram for explaining the semiconductor device according to some example embodiments.
Figure 24:
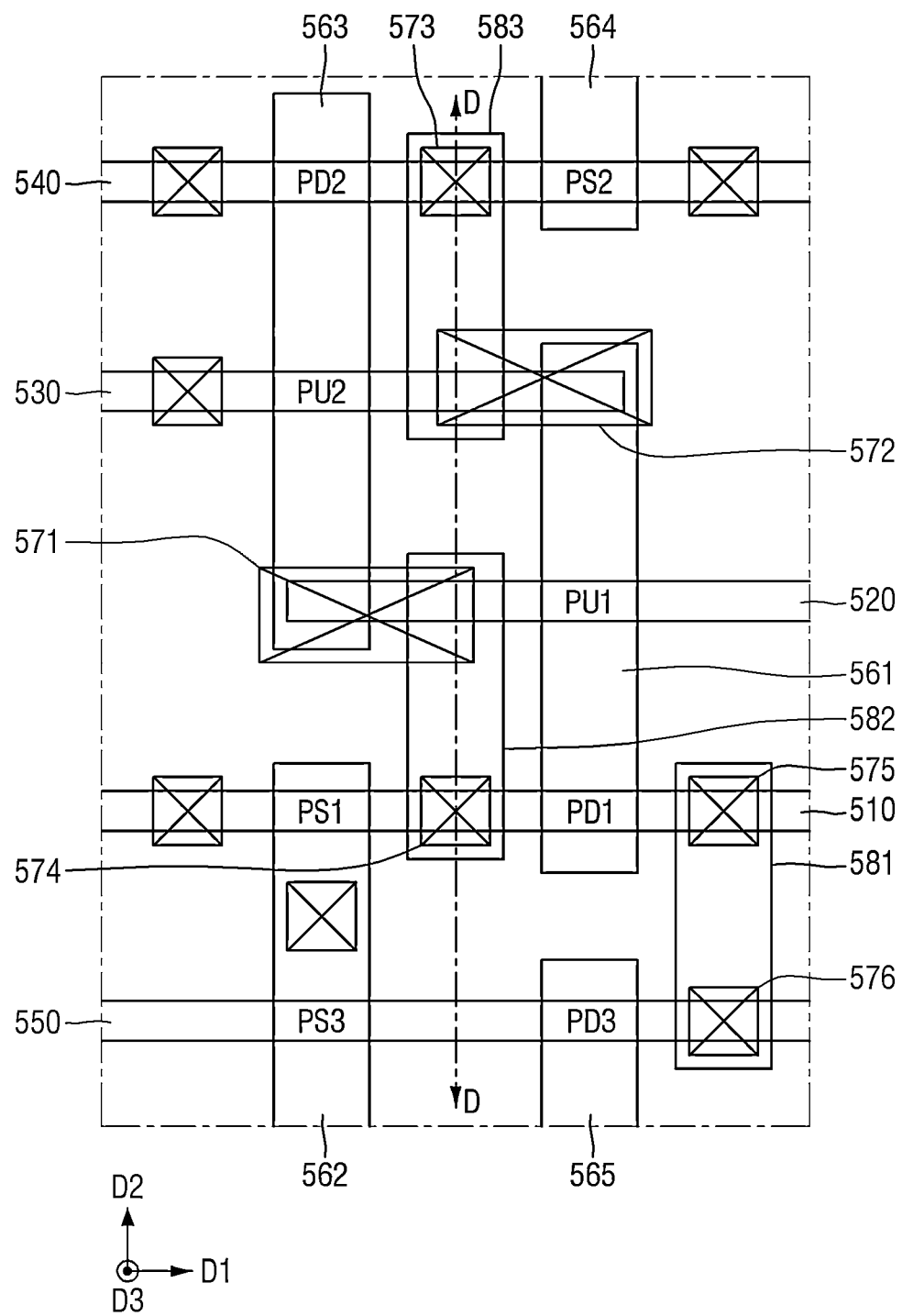
FIG. 24 is a layout diagram showing the semiconductor device of FIG. 23.
Figure 25:
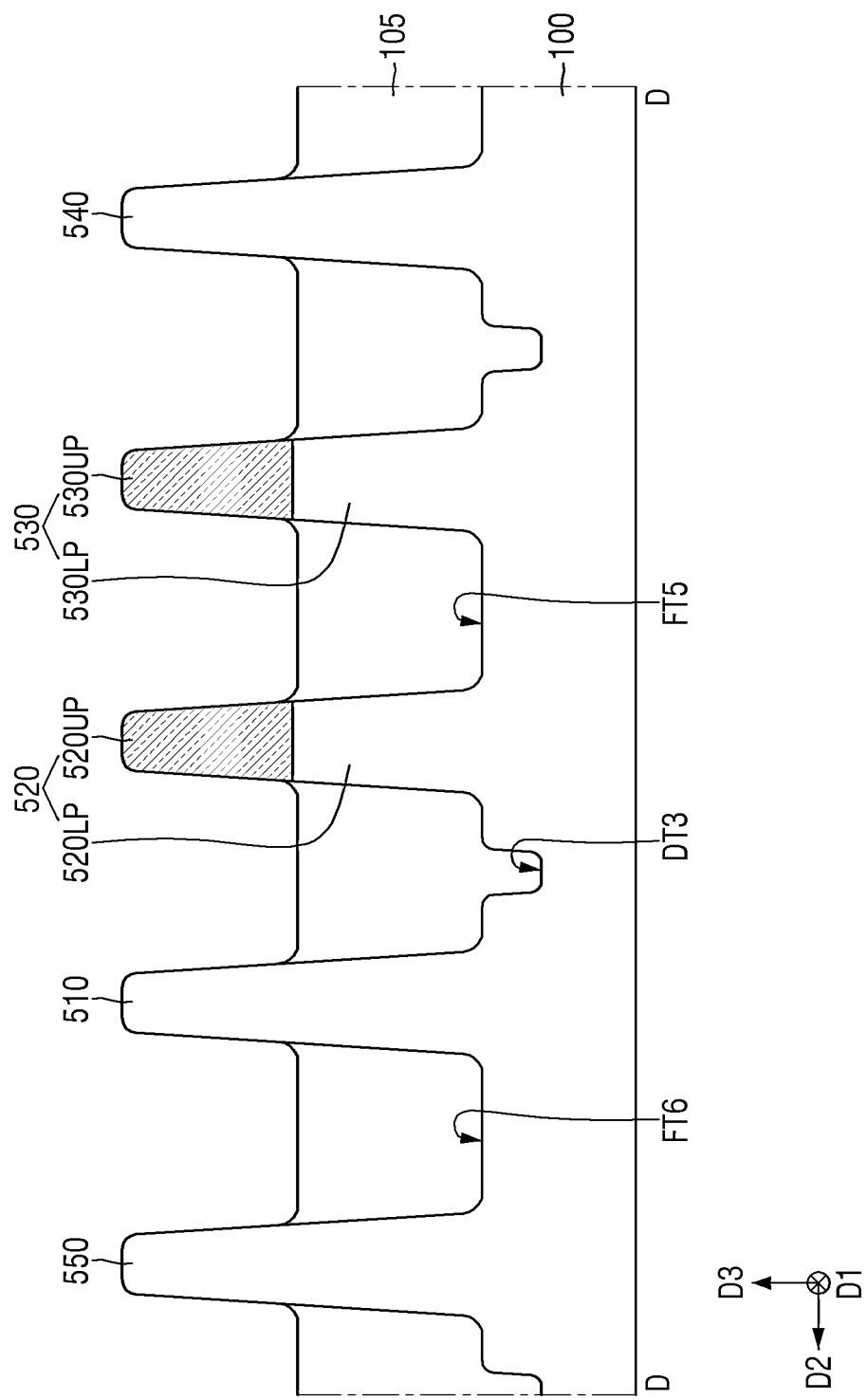
FIG. 25 is a cross-sectional view taken along D-D of FIG. 24.

FIG. 23 is a circuit diagram for explaining the semiconductor device according to some example embodiments. FIG. 24 is a layout diagram showing the semiconductor device of FIG. 23. FIG. 25 is a cross-sectional view taken along D-D of FIG. 24. For reference, FIG. 25 shows only the fifth to ninth fin type patterns 510, 520, 530, 540, and 550.

Referring to FIGS. 23 and 24, the semiconductor device according to some example embodiments may include a pair of inverters INV1 and INV2 connected in parallel between a power supply node VCC and a ground node VSS, and a first pass transistor PS1 and a second pass transistor PS2 connected to output nodes of the respective inverters INV1 and INV2. The first pass transistor PS1 and the second pass transistor PS2 may be connected to a bit line BL and a complementary bit line/BL, respectively. Gates of the first pass transistor PS1 and the second pass transistor PS2 may be connected to the word line WL. The semiconductor device may include, for example, a static random access memory (SRAM), and the pair of inverters INV1 and INV2, the first pass transistor PS1 and a second pass transistor PS2 may correspond to transistors of an SRAM cell. The SRAM cell may be a six-transistor (6T) cell, or may include fewer or more transistors than those illustrated in FIGS. 23 to 25.

The first inverter INV1 includes a first pull-up transistor PU1 and a first pull-down transistor PD1 connected in series, and a second inverter INV2 includes a second pull-up transistor PU2 and a second pull-down transistor PD2 connected in series. The first pull-up transistor PU1 and the second pull-up transistor PU2 may be PMOS transistors, and the first pull-down transistor PD1 and second pull-down transistor PD2 may be NMOS transistors. Also, in order that the first inverter INV1 and the second inverter INV2 form a single latch circuit, an input node of the first inverter INV1 is connected to an output node of the second inverter INV2, and an input node of the second inverter INV2 is connected to an output node of the first inverter INV1.

Here, referring to FIGS. 23 and 24, a fifth fin type pattern 510, a sixth fin type pattern 520, a seventh fin type pattern 530, an eighth fin type pattern 540 and a ninth fin type pattern 550 spaced apart from each other are formed to extend long in the first direction D1. The sixth fin type pattern 520 and the seventh fin type pattern 530 may have an extension length shorter than those of the fifth fin type pattern 510, the eighth fin type pattern 540, and the ninth fin type pattern 550.

Further, a first conductive line 561, a second conductive line 562, a third conductive line 563, a fourth conductive line 564, and a fifth conductive line 565 extend long in the second direction D2, and are formed to intersect the fifth to ninth fin type patterns 510, 520, 530, 540, and 550. Specifically, the first conductive line 561 completely intersects the fifth fin type pattern 510 and the sixth fin type pattern 520, and may partially overlap the end of the seventh fin type pattern 530. The third conductive line 563 completely intersects the eighth fin type pattern 540 and the seventh fin type pattern 530, and may partially overlap the end of the sixth fin type pattern 520. The second conductive line 562 completely intersects the fifth fin type pattern 510 and the ninth fin type pattern 550. The fourth conductive line 564 is formed to intersect the eighth fin type pattern 540, and the fifth conductive line 565 is formed to intersect the ninth fin type pattern 550.

As shown, the first pull-up transistor PU1 is defined around the region in which the first conductive line 561 and the sixth fin type pattern 520 intersect, the first pull-down transistor PD1 is defined around the region in which the first conductive line 561 and the fifth fin type pattern 510 intersect, and the first pass transistor PS1 is defined around the region in which the second conductive line 562 and the fifth fin type pattern 510 intersect. The second pull-up transistor PU2 is defined around the region in which the third conductive line 563 and the seventh fin type pattern 530 intersect, the second pull-down transistor PD2 is defined around the region in which the third conductive line 563 and the eighth fin type pattern 540 intersect, and the second pass transistor PS2 is defined around the region in which the fourth conductive line 564 and the eighth fin type pattern 540 intersect. Further, the third pull-down transistor PD3 is defined around the region in which the fifth conductive line 565 and the ninth fin type pattern 550 intersect, and the third pass transistor PS3 is defined around the region in which the second conductive line 562 and the ninth fin type pattern 550 intersect.

Although it is not illustrated, a source/drain may be formed on both sides of the region in which the first to fifth conductive lines 561 to 565 and the fifth to ninth fin type patterns 510, 520, 530, 540, and 550 intersect. Also, a large number of contacts may be formed. Furthermore, the contacts 575 and 576 are connected by a first sharing contact 581. Also, the contacts 571 and 574 are connected by a second sharing contact 582. The contacts 572 and 573 are connected by a third sharing contact 583.

Referring to FIG. 25, the sixth fin type pattern 520 and the seventh fin type pattern 530 may be placed in the PMOS formation region. The fifth fin type pattern 510, the eighth fin type pattern 540, and the ninth fin type pattern 550 may be placed in the NMOS formation region.

The sixth fin type pattern 520 and the seventh fin type pattern 530 may be defined by a fifth fin trench FTS. The sixth fin type pattern 520 may include a sixth lower fin type pattern 520LP, and a sixth upper fin type pattern 520UP. A seventh fin type pattern 530 may include a seventh lower fin type pattern 530LP, and a seventh upper fin type pattern 530UP. The description of the sixth fin type pattern 520 and the seventh fin type pattern 530 is substantially the same as the description of the first fin type pattern 110.

The fifth fin type pattern 510, the eighth fin type pattern 540 and the ninth fin type pattern 550 may be defined by a sixth fin trench FT6. The description of the fifth fin type pattern 510, the eighth fin type pattern 540 and the ninth fin type pattern 550 is substantially the same as the description of the second fin type pattern 210.

A third deep trench DT3 may be formed between the fifth fin type pattern 510 placed in the NMOS formation region and the sixth fin type pattern 520 placed in the PMOS formation region. Further, a third deep trench DT3 may be formed between the eighth fin type pattern 540 placed in the NMOS formation region and the seventh fin type pattern 530 placed in the PMOS formation region.

Example embodiments are not limited to those described above. Furthermore unless clear from context example embodiments are not necessarily mutually exclusive to one another. For example, some example embodiments may include features described with reference to one figure, and may also include features described with reference to another figure.

Figure 26:
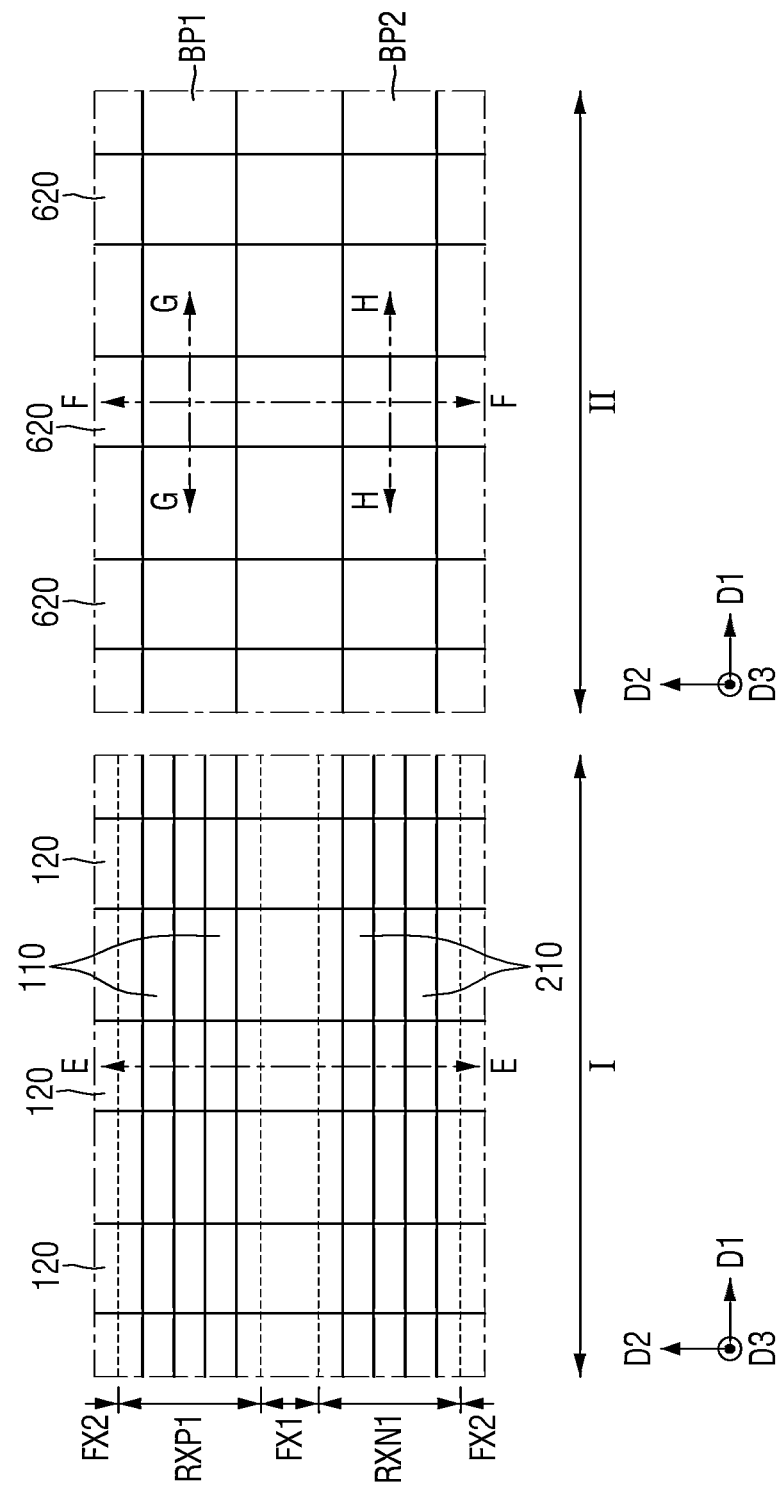
FIG. 26 is an example layout diagram for explaining the semiconductor device according to some example embodiments.
Figure 27:
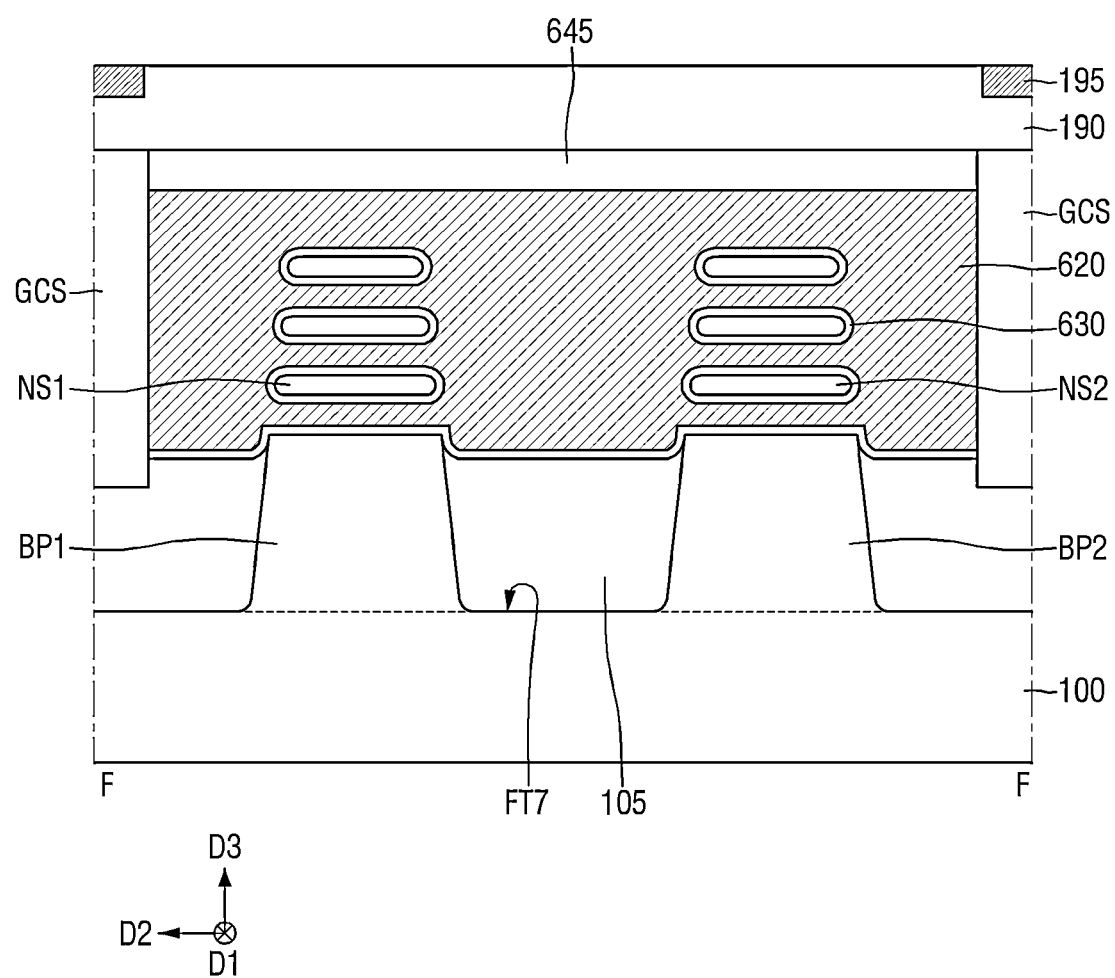
FIGS. 27 to 29 are cross-sectional views taken along F-F, G-G, and H-H of FIG. 26.
Figure 28:
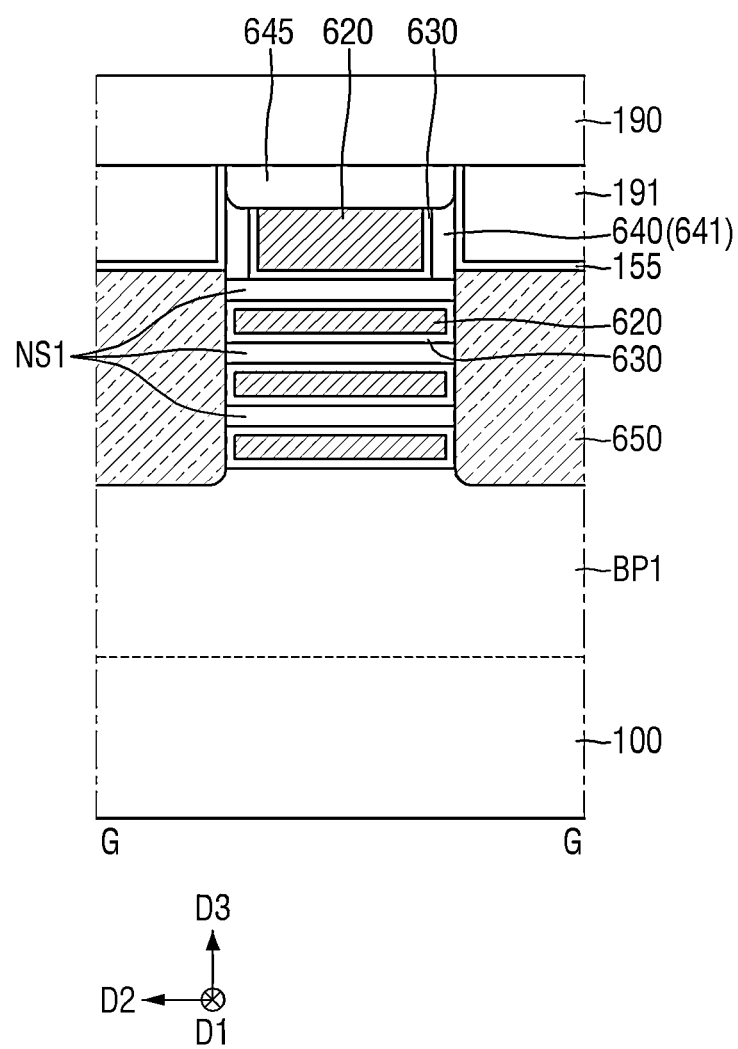
Figure 29:
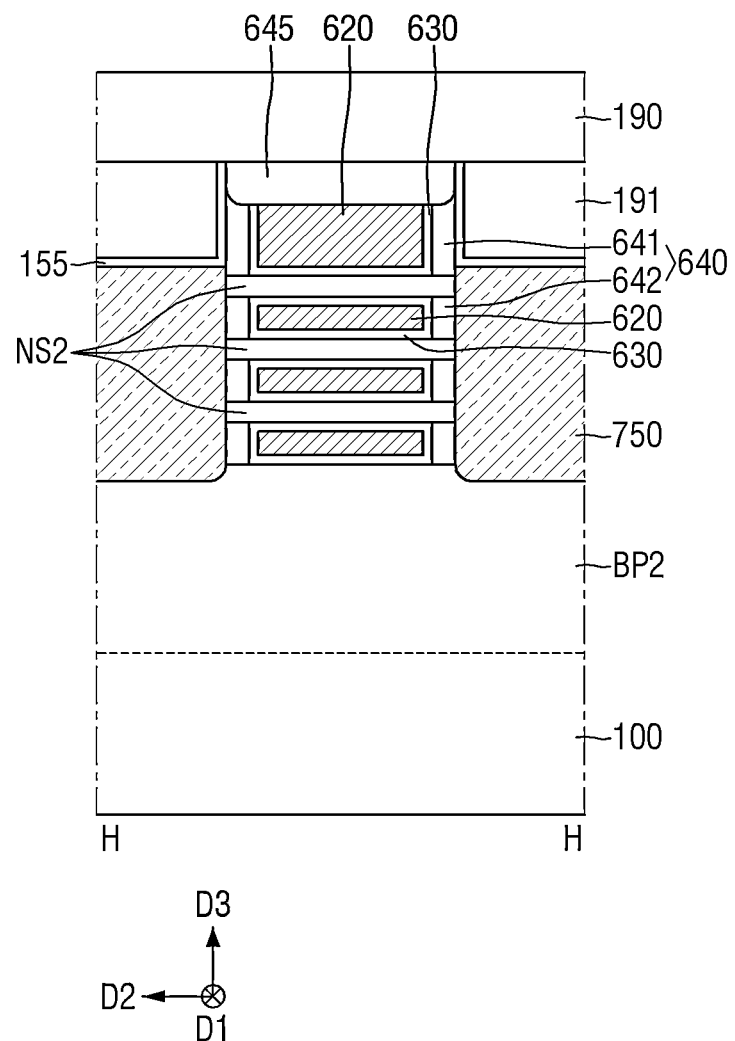

FIG. 26 is an example layout diagram for explaining the semiconductor device according to some example embodiments. FIGS. 27 to 29 are cross-sectional views taken along F-F, G-G, and H-H of FIG. 26.

For reference, FIG. 26 is a part of the layout diagram shown in FIG. 1. For example, the cross-sectional view taken along E-E of FIG. 26 may be a portion corresponding to the first p-type active region RXP1 and the first n-type active region RXN1 in one of FIGS. 2, 10, and 16 to 22. The description of a first region I of FIG. 18 may be substantially the same as that described using FIGS. 1 to 14. Therefore, the following description will focus on the contents relating to a second region II of FIG. 26.

Referring to FIGS. 26 to 29, in the semiconductor device according to some example embodiments, the substrate 100 includes a first region I and a second region II.

The first region I may be or correspond to a high-voltage operating region. The second region II may be or correspond to a low-voltage operating region. For example, the first region I may be an I/O region. The second region II may be a logic region and/or an SRAM region.

A fourth gate electrode 620, a first lower pattern BP1, a second lower pattern BP2, a first sheet pattern NS1, and a second sheet pattern NS2 may be placed in the second region II. The first lower pattern BP1 and the first sheet pattern NS1 may be placed in the PMOS formation region. The second lower pattern BP2 and the second sheet pattern NS2 may be placed in the NMOS formation region.

The first lower pattern BP1 and the second lower pattern BP2 may each protrude from the substrate 100. The first lower pattern BP1 and the second lower pattern BP2 may each extend long in the first direction D1. The first lower pattern BP1 and the second lower pattern BP2 may be separated by a seventh fin trench FT7.

A plurality of first sheet patterns NS1 may be placed on the first lower pattern BP1. The plurality of first sheet patterns NS1 may be spaced apart from the first lower pattern BP1 in the third direction D3. A plurality of second sheet patterns NS2 may be placed on the second lower pattern BP2. The plurality of second sheet patterns NS2 may be spaced apart from the second lower pattern BP2 in the third direction D3. Although the number of the first sheet patterns NS1 and the second sheet patterns NS2 are shown as three, the number thereof is not limited thereto.

In the semiconductor device according to some example embodiments, the first lower pattern BP1 and the second lower pattern BP2 may each be a silicon lower pattern including silicon. The first sheet pattern NS1 and the second sheet pattern NS2 may each be a silicon sheet pattern including silicon.

The field insulating film 105 may cover the sidewalls of the first lower pattern BP1 and the second lower pattern BP2. The field insulating film 105 is not formed on the upper surface of the first lower pattern BP1 and the upper surface of the second lower pattern BP2.

The fourth gate electrode 620 may extend in the second direction D2. The fourth gate electrode 620 may be formed on the first lower pattern BP1 and the second lower pattern BP2. The fourth gate electrode 620 may intersect the first lower pattern BP1 and the second lower pattern BP2. The fourth gate electrode 620 may wrap the first sheet pattern NS1 and the second sheet pattern NS2.

The fourth gate insulating film 630 may extend along the upper surface of the field insulating film 105, the upper surface of the first lower pattern BP1, and the upper surface of the second lower pattern BP2. The fourth gate insulating film 630 may wrap the first sheet pattern NS1 and the second sheet pattern NS2. The fourth gate insulating film 630 may be placed along the periphery of the first sheet pattern NS1 and the periphery of the second sheet pattern NS2. The fourth gate electrode 620 is placed on the fourth gate insulating film 630. The fourth gate insulating film 630 is placed between the fourth gate electrode 620 and the first sheet pattern NS1, and between the fourth gate electrode 620 and the second sheet pattern NS2.

The second gate spacer 640 may be placed on the sidewall of the fourth gate electrode 620.

In FIG. 28, the second gate spacer 640 placed on the first lower pattern BP1 may include only an outer spacer 641. No inner spacer is placed between the first lower pattern BP1 and the first sheet pattern NS1, and between the adjacent first sheet patterns NS1.

In FIG. 29, the second gate spacer 640 placed on the second lower pattern BP2 may include an outer spacer 641 and an inner spacer 642. The inner spacer 642 may be placed between the second lower pattern BP2 and the second sheet pattern NS2, and between the adjacent second sheet patterns NS2.

A fourth gate capping pattern 645 may be placed on the fourth gate electrode 620 and the second gate spacer 640.

A third source/drain pattern 650 may be formed on the first lower pattern BP1. The third source/drain pattern 650 is connected to the first sheet pattern NS1. The third source/drain pattern 650 may include p-type impurities.

A fourth source/drain pattern 750 may be formed on the second lower pattern BP2. The fourth source/drain pattern 750 is connected to the second sheet pattern NS2. The fourth source/drain pattern 750 may include n-type impurities.

FIGS. 30 to 36 are intermediate stage diagrams for explaining a method for fabricating a semiconductor device according to some example embodiments. For reference, FIGS. 30 to 36 may be a part of a cross-sectional view taken along A-A of FIG. 1.

Figure 30:
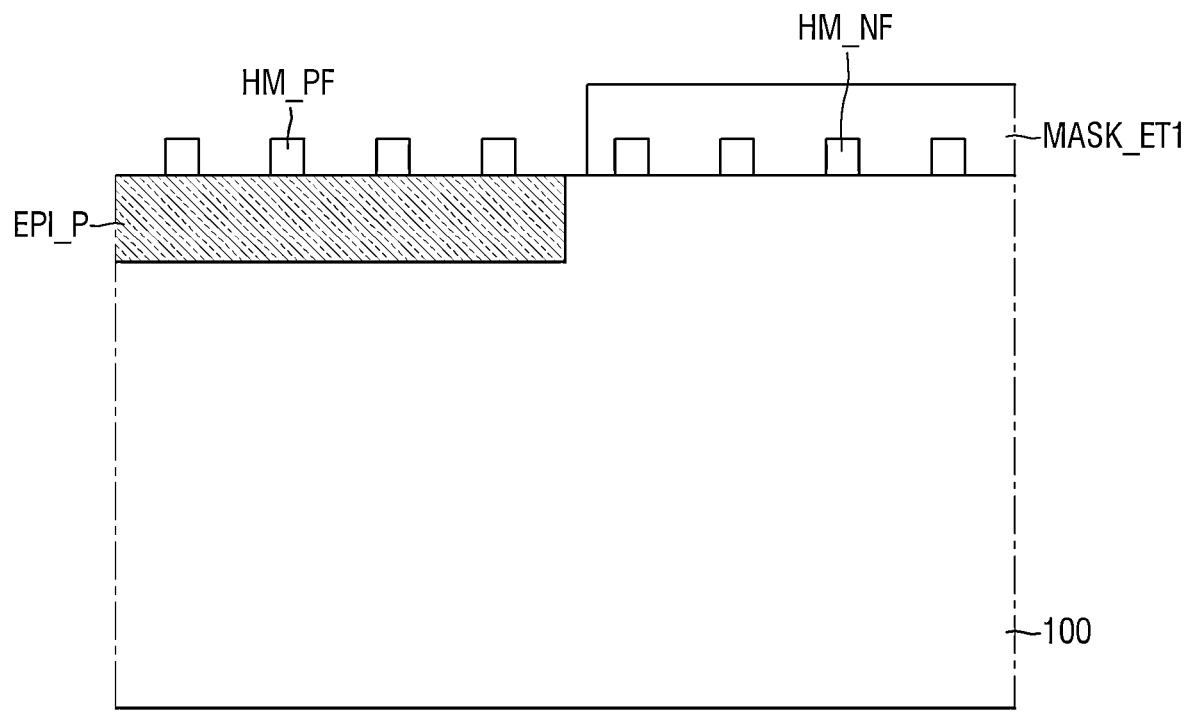
FIGS. 30 to 36 are intermediate stage diagrams for explaining a method for fabricating a semiconductor device according to some example embodiments.

Referring to FIG. 30, an epitaxial pattern EPI_P is formed inside the substrate 100. For example, a part of the substrate 100 is etched to form a pattern trench inside the substrate 100. The epitaxial pattern EPI_P is formed inside the pattern trench through an epitaxial process. The epitaxial pattern EPI_P may be a homogeneous epitaxial pattern, or may be a heterogeneous epitaxial pattern. The epitaxial pattern EP_P may include impurities, such as boron; however, example embodiments are not limited thereto.

Subsequently, a first fin hard mask HM_PF is formed at a position that overlaps the epitaxial pattern EPI_P. A second fin hard mask HM_NF is formed at a position that does not overlap the epitaxial pattern EPI_P.

Subsequently, a first etching mask MASK_ET1 is formed on the substrate 100. The first etching mask MASK_ET1 does not overlap the epitaxial pattern EPI_P.

Figure 31:
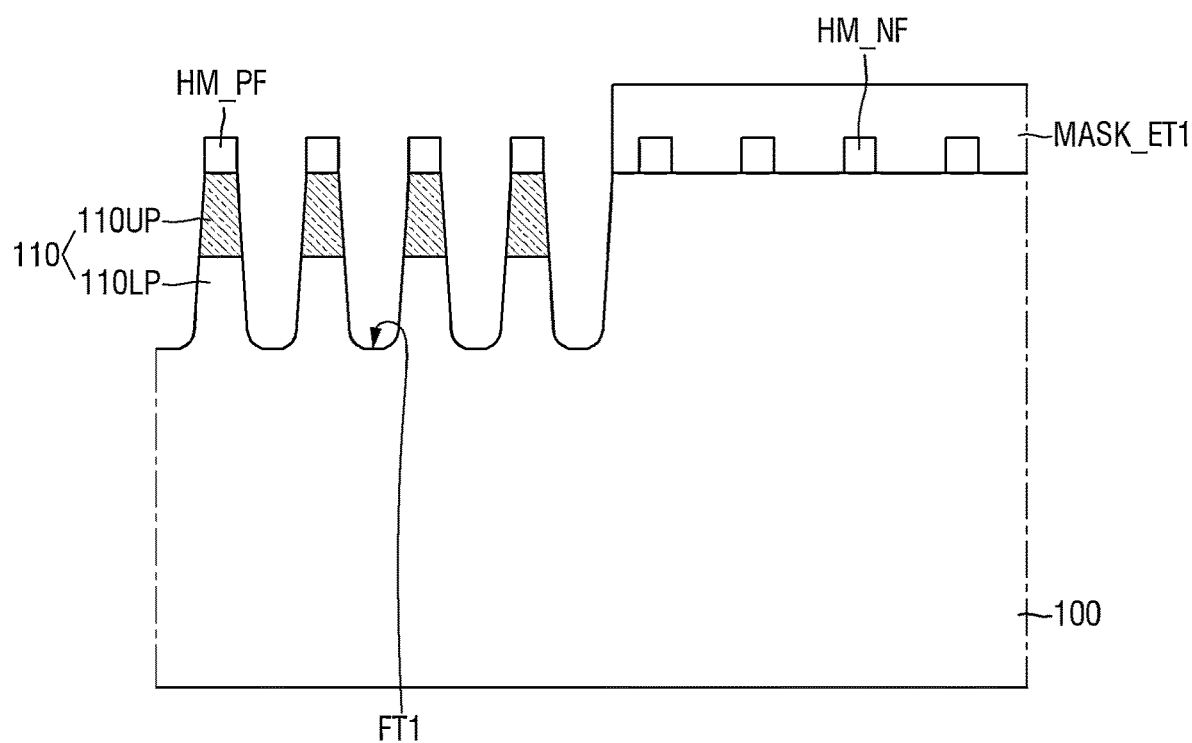

Referring to FIG. 31, the first fin type pattern 110 is formed, using the first etching mask MASK_ET1 and the first fin hard mask HM_PF.

The first fin type pattern 110 may be defined by the first fin trench FT1.

Figure 32:
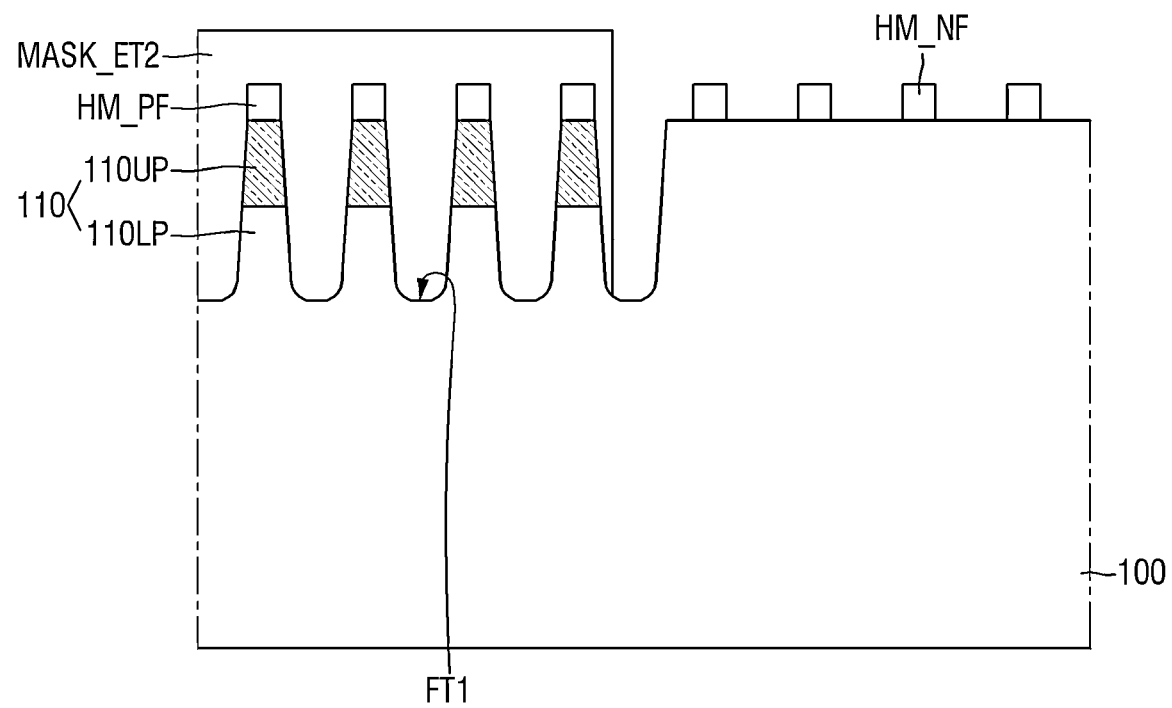

Referring to FIGS. 31 and 32, after removing the first etching mask MASK_ET1, a second etching mask MASK_ET2 is formed on the first fin type pattern 110.

A part of the first fin trench FT1 is exposed by the second etching mask MASK_ET2. The exposed first fin trench FT1 may be closest to the second fin hard mask HM_NF.

Figure 33:
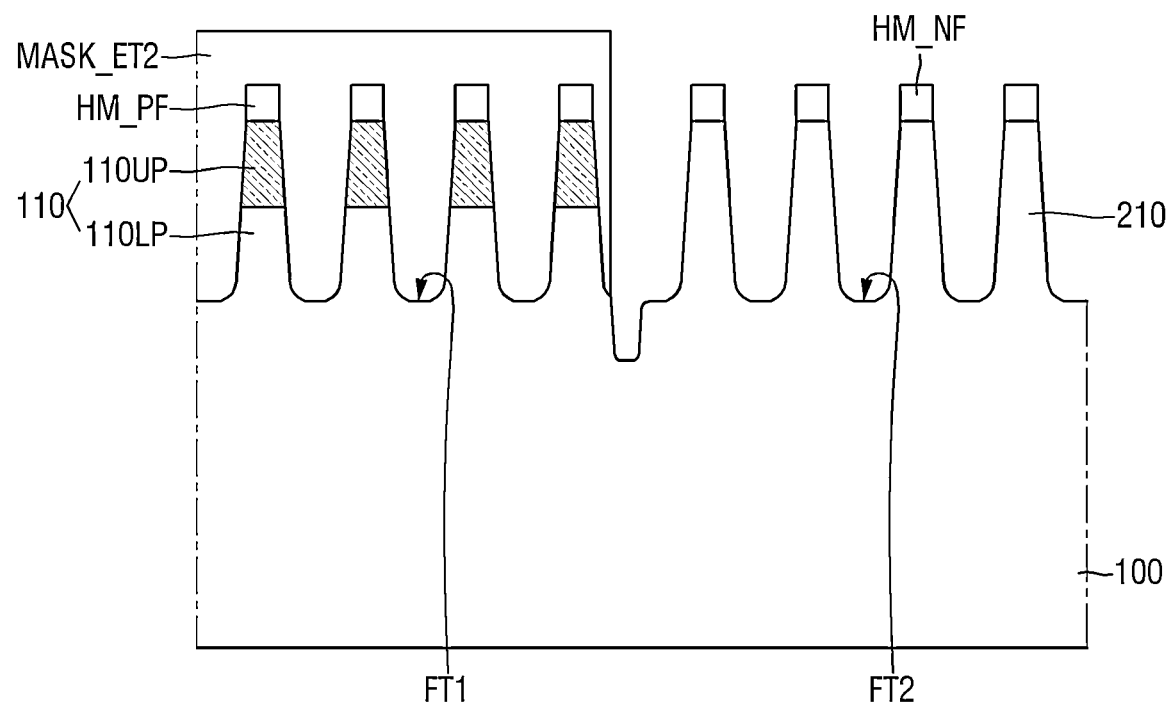

Referring to FIG. 33, a second fin type pattern 210 is formed, using the second etching mask MASK_ET2 and the second fin hard mask HM_NF.

The second fin type pattern 210 may be defined by the second fin trench FT2.

A boundary trench deeper than the first fin trench FT1 and the second fin trench FT2 is formed between the first fin type pattern 110 and the second fin type pattern 210 closest to each other.

Figure 34:
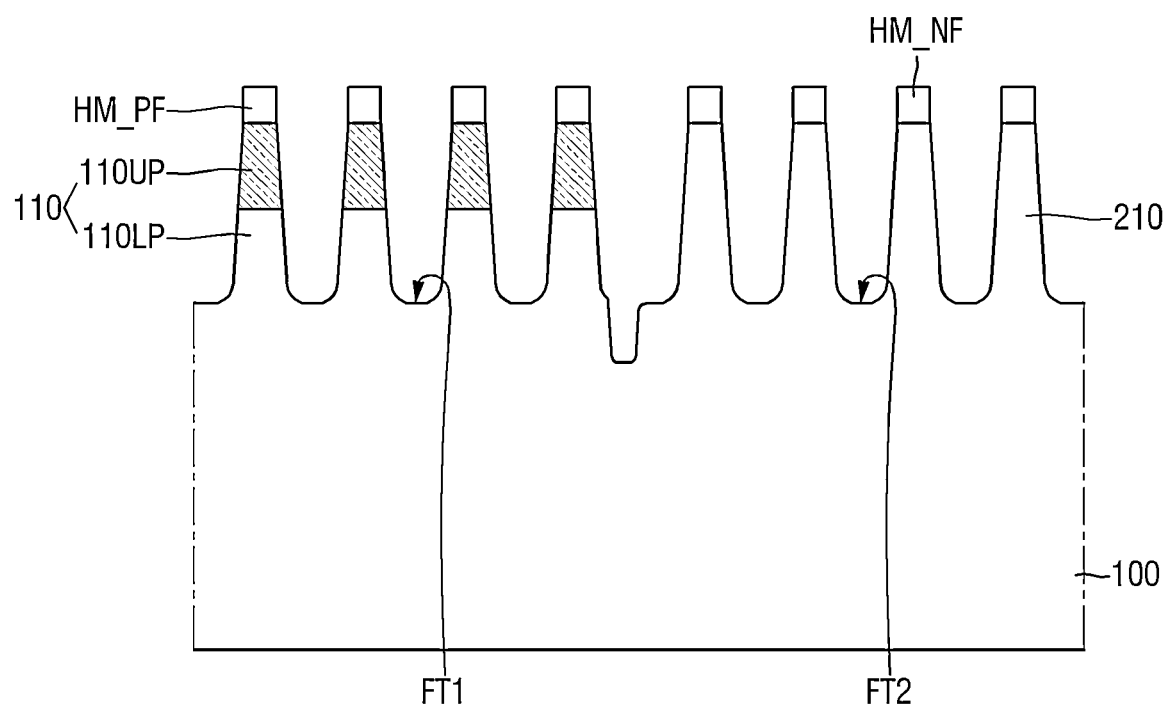
Figure 35:
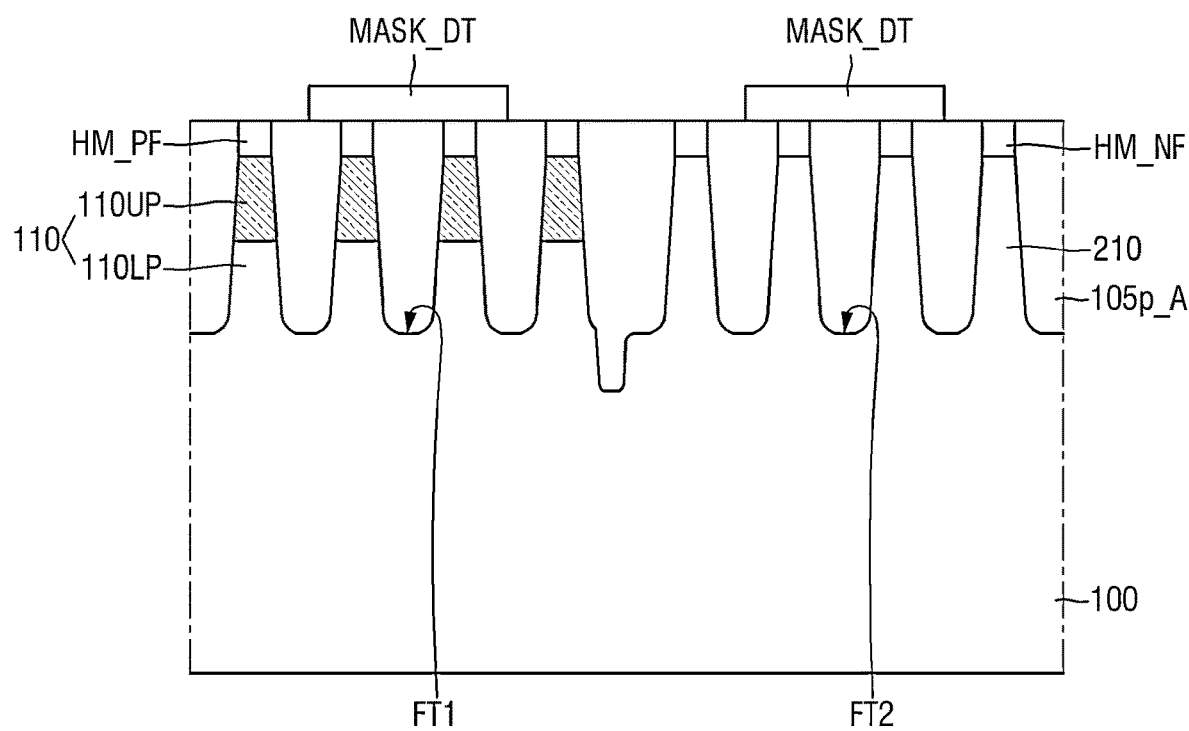

Referring to FIGS. 34 and 35, the second etching mask MASK_ET2 is removed.

Subsequently, a pre field insulating film 105p_A that fills the first fin trench FT1 and the second fin trench FT2 may be formed on the substrate 100.

Subsequently, a deep trench mask MASK_DT may be formed on the pre field insulating film 105p_A. The deep trench masks MASK_DT may not overlap vertically a part of the first fin type pattern 110 and a part of the second fin type pattern 210.

Figure 36:
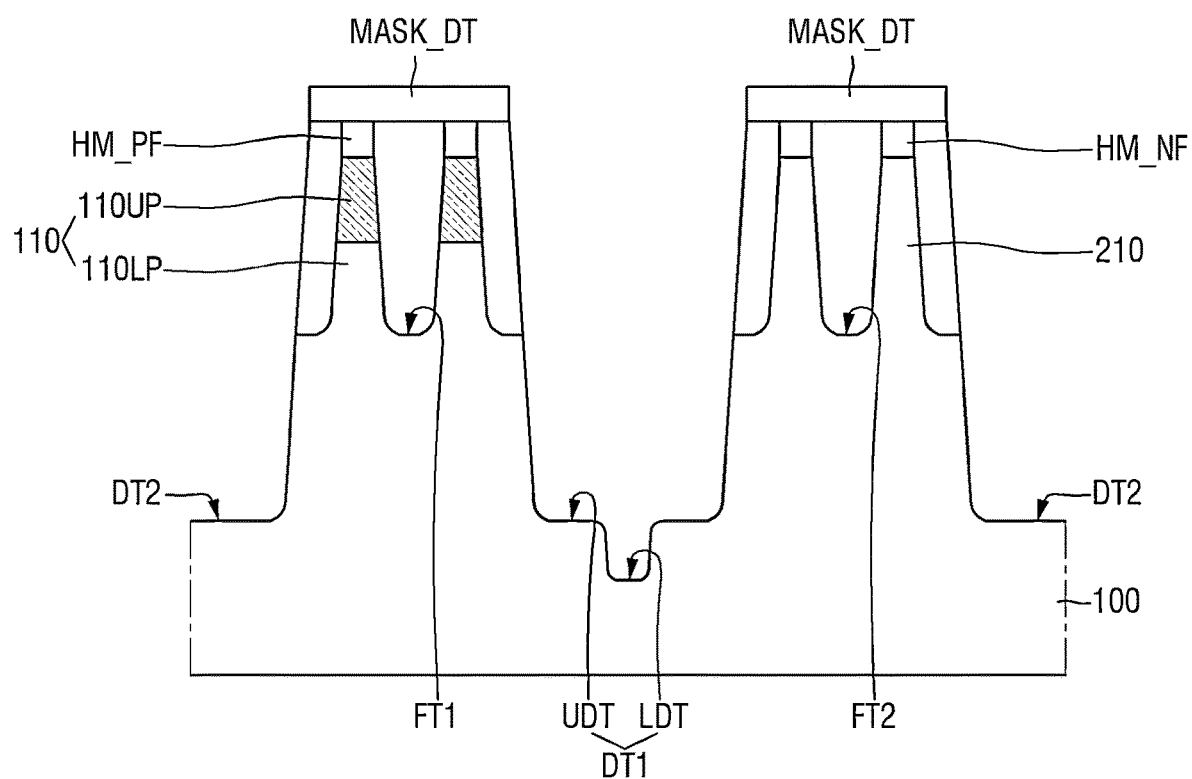

Referring to FIG. 36, a first deep trench DT1 and a second deep trench DT2 may be formed, using the deep trench mask MASK_DT.

While the first deep trench DT1 and the second deep trench DT2 are being formed, the first fin type pattern 110 and the second fin type pattern 210 that do not overlap the deep trench mask MASK_DT are also removed.

The lower trench LDT may be formed at a position corresponding to the boundary trench described in FIG. 33.

Subsequently, the deep trench mask MASK_DT is removed. Also, the first fin hard mask HM_PF and the second fin hard mask HM_NF are removed. An additional field insulating film that fills the first deep trench DT1 and the second deep trench DT2 may be formed. Subsequently, a part of the additional field insulating film and the pre field insulating film 105p_A may be removed to form the field insulating film (105 of FIG. 2).

FIGS. 37 to 41 are intermediate stage diagrams for explaining the method for fabricating the semiconductor device according to some example embodiments.

Figure 37:
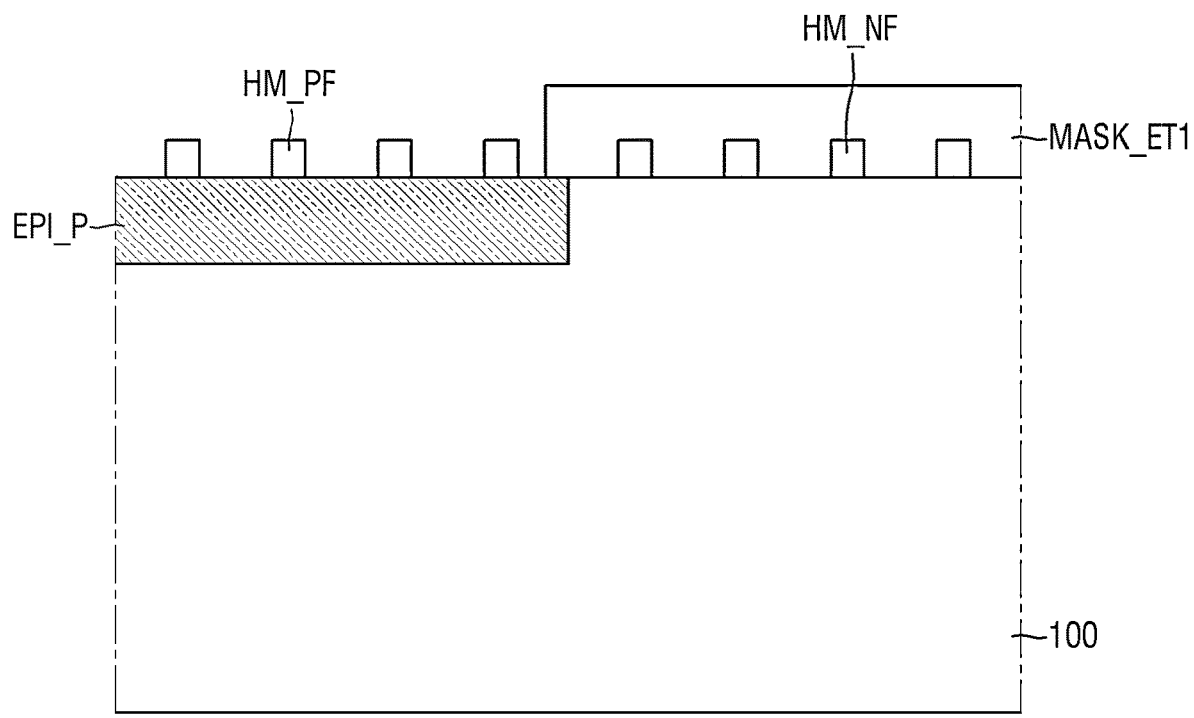
FIGS. 37 to 41 are intermediate stage diagrams for explaining the method for fabricating the semiconductor device according to some example embodiments.

Referring to FIG. 37, the first etching mask MASK_ET1 that overlaps a part of the epitaxial pattern EPI_P is formed on the substrate 100.

Figure 38:
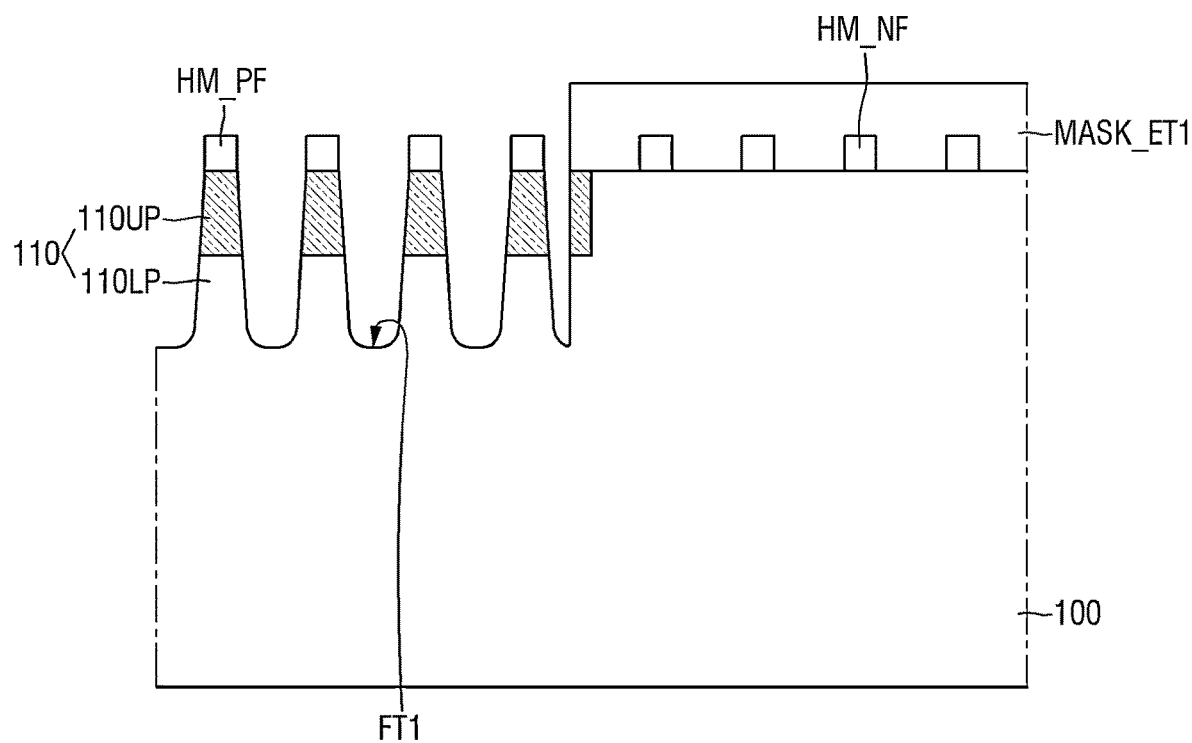

Referring to FIG. 38, the first fin type pattern 110 is formed, using the first etching mask MASK_ET1 and the first fin hard mask HM_PF. The remainder of the epitaxial pattern EPI_P may remain on the substrate 100, while the first fin type pattern 110 is being formed.

Figure 39:
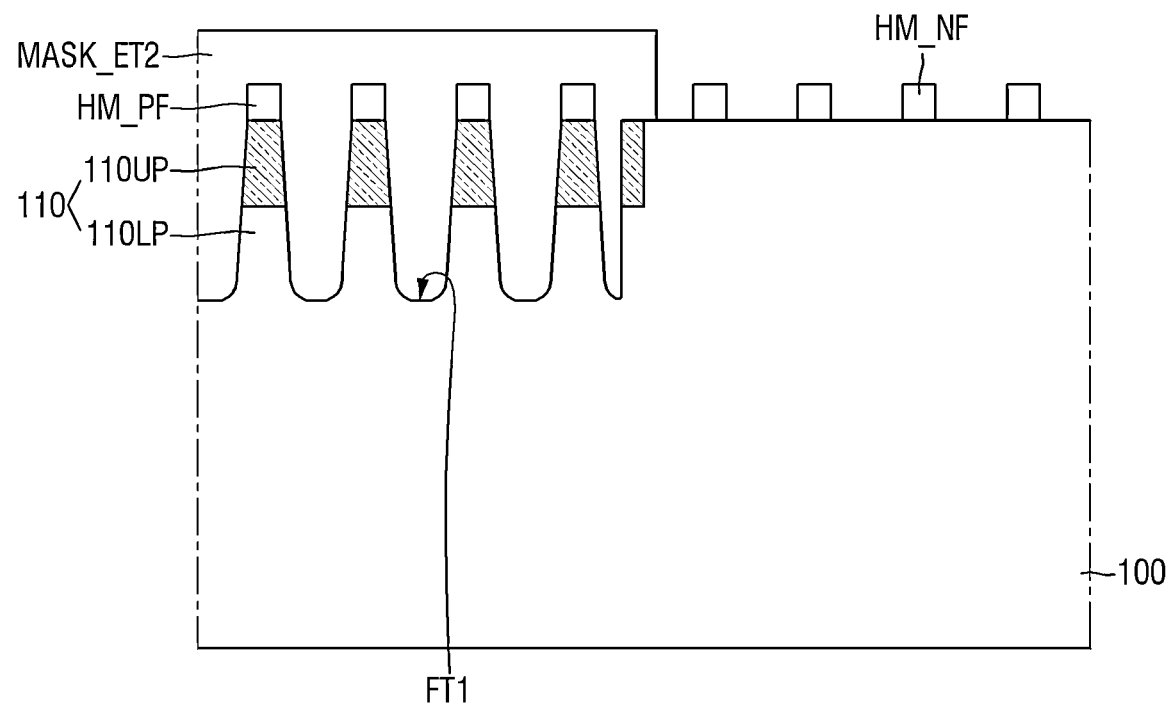

Referring to FIGS. 38 and 39, after removing the first etching mask MASK_ET1, the second etching mask MASK_ET2 is formed on the first fin type pattern 110.

The second etching mask MASK_ET2 may cover the remainder of the epitaxial pattern EPI_P.

Figure 40:
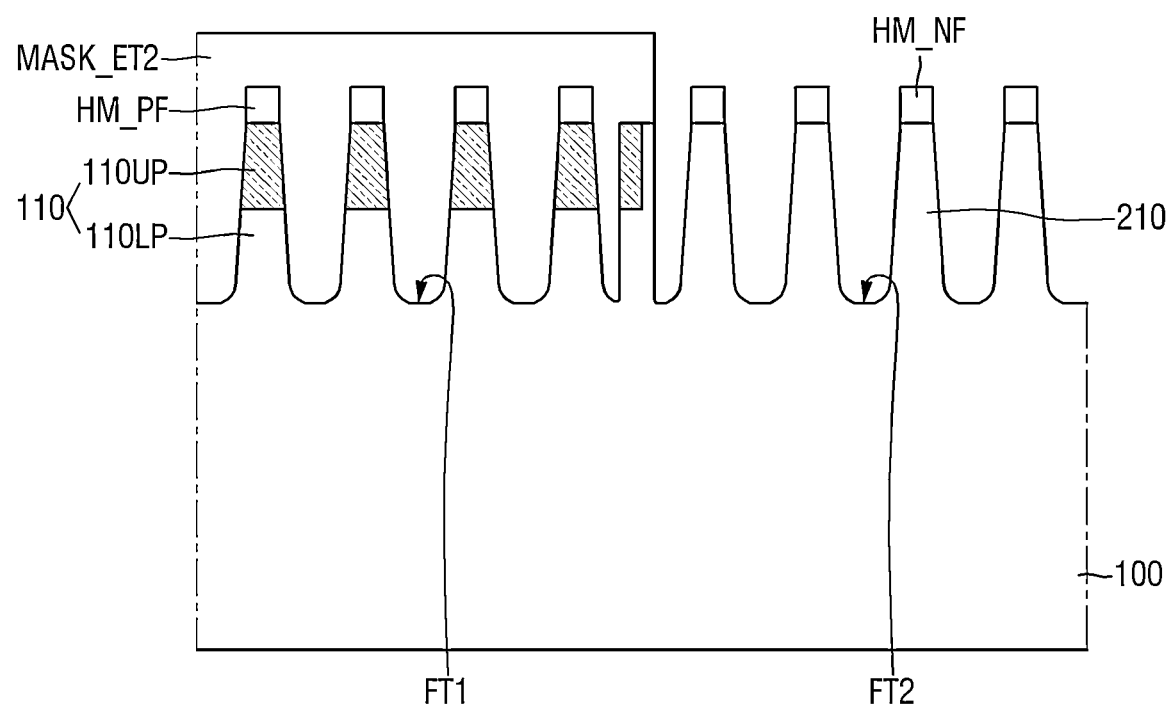
Figure 41:
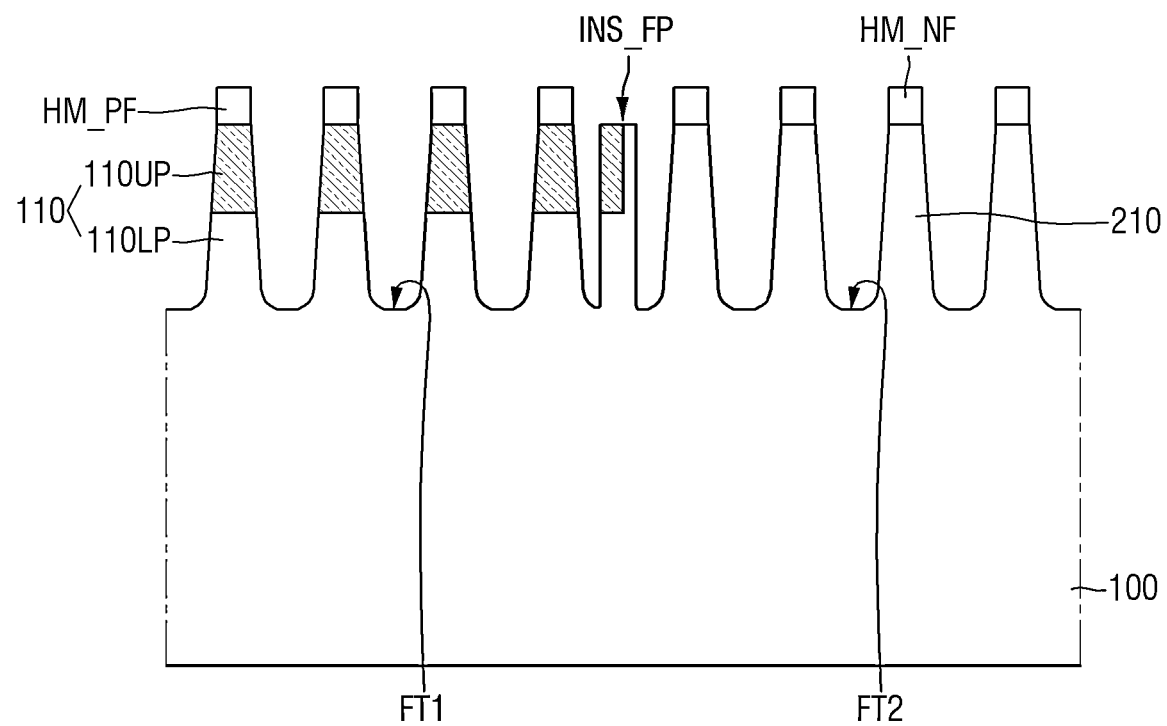

Referring to FIGS. 40 and 41, a second fin type pattern 210 is formed, using the second etching mask MASK_ET2 and the second fin hard mask HM_NF.

While the second fin type pattern 210 is being formed, an insertion fin type pattern INS_FP may be formed between the first fin type pattern 110 and the second fin type pattern 210. The first fin hard mask HM_PF and the second fin hard mask HM_NF are not placed on the insertion fin type pattern INS_FP.

Subsequently, the second etching mask MASK_ET2 is removed.

Subsequently, the first deep trench DT1 and the second deep trench DT2 may be formed in a manner similar to that described in FIGS. 35 and 36. Since the fin hard masks HM_PF and HM_NF do not remain on the insertion fin type pattern INS_FP, the insertion fin type pattern INS_FP may be removed faster than the first fin type pattern 110 and the second fin type pattern 210. For example, the lower trench (LDT of FIG. 36) may be formed at a position corresponding to the insertion fin type pattern INS_FP.

Unlike that mentioned above, some example embodiments may have that the first fin type pattern 110 formed after forming the second fin type pattern 210.

In concluding the detailed description, those of ordinary skill in the art will appreciate that many variations and modifications may be made to example embodiments without substantially departing from the principles of inventive concepts. Therefore, example embodiments of inventive concepts are used in a generic and descriptive sense only and not for purposes of limitation.

What is claimed is:

1. A semiconductor device comprising:
a substrate;
a first base fin protruding from the substrate and extending in a first direction;
a first fin type pattern protruding from the first base fin and extending in the first direction;
a field insulating film on the substrate; and
a gate electrode intersecting the first fin type pattern on the field insulating film, and extending in a second direction that is perpendicular to the first direction,
wherein the first base fin includes a first sidewall and a second sidewall, the first and second sidewalls extending in the first direction, the first sidewall opposite to the second sidewall,
the first sidewall of the first base fin at least partially defines a first deep trench,
the second sidewall of the first base fin at least partially defines a second deep trench,
a depth of the first deep trench is greater than a depth of the second deep trench,
the first fin type pattern includes a lower fin type pattern, and an upper fin type pattern directly connected to the lower fin type pattern, the upper fin type pattern on the lower fin type pattern,
the lower fin type pattern includes the same material as the first base fin,
the lower fin type pattern includes a material different from the upper fin type pattern,
the field insulating film fills the first deep trench and the second deep trench, and covers a part of sidewalls of the first fin type pattern, and
the gate electrode overlaps the upper fin type pattern in a third direction that is perpendicular to the first direction and the second direction.

2. The semiconductor device of claim 1, wherein the first deep trench includes an upper trench, and a lower trench on a bottom surface of the upper trench,
a width of the upper trench is greater than a width of the lower trench, and
the first sidewall of the first base fin at least partially defines the upper trench.

3. The semiconductor device of claim 2, further comprising:
a second base fin protruding from the substrate and extending in the first direction; and
a second fin type pattern protruding from the second base fin and extending in the first direction,
wherein the second deep trench separates the first base fin from the second base fin, and
the first base fin and the second base fin are in a transistor region of a first conductive type.

4. The semiconductor device of claim 2, further comprising:
a second base fin protruding from the substrate and extending in the first direction; and
a second fin type pattern protruding from the second base fin and extending in the first direction,
wherein the first deep trench separates the first base fin from the second base fin, and
the first base fin and the second base fin are in transistor regions of different conductive types.

5. The semiconductor device of claim 2, wherein the upper trench has a recess at a point on which sidewalls of the upper trench and a bottom surface of the upper trench meet.

6. The semiconductor device of claim 1, wherein the upper fin type pattern has a single film structure.

7. The semiconductor device of claim 1, wherein the upper fin type pattern includes a first upper pattern directly connected to the lower fin type pattern, and a second upper pattern directly connected to the first upper pattern, and
the first upper pattern includes a material different from the second upper pattern.

8. The semiconductor device of claim 7, wherein the second upper pattern includes the same material as the lower fin type pattern.

9. A semiconductor device comprising:
a substrate;
a first base fin and a second base fin, the first base fin and the second base fin protruding from the substrate and separated from each other in a first direction by a deep trench;
a first fin type pattern protruding from the first base fin, the first fin type pattern at least partially defining a first fin trench;
a second fin type pattern protruding from the second base fin, the second fin type pattern at least partially defining a second fin trench; and a gate electrode intersecting the first fin type pattern, and extending in a second direction that is perpendicular to the first direction, wherein the deep trench includes an upper trench, and a lower trench on a bottom surface of the upper trench, a sidewall of the first base fin and a sidewall of the second base fin at least partially define the upper trench, the first fin type pattern includes a lower fin type pattern, and an upper fin type pattern directly connected to the lower fin type pattern, the upper fin type pattern on the lower fin type pattern, the lower fin type pattern includes the same material as the first base fin, the lower fin type pattern includes a material different from the upper fin type pattern, and the gate electrode overlaps the upper fin type pattern in a third direction that is perpendicular to the first direction and the second direction.

10. The semiconductor device of claim 9, wherein a depth of the upper trench is less than a depth of the lower trench, the depth of the upper trench measured from a bottom surface of the first fin trench.

11. The semiconductor device of claim 9, wherein the first base fin and the first fin type pattern are in a PMOS region, and the second base fin and the second fin type pattern are in an NMOS region.

12. The semiconductor device of claim 11, wherein the lower fin type pattern includes a silicon film, the upper fin type pattern includes a silicon-germanium film, and the second fin type pattern includes a silicon fin type pattern.

13. The semiconductor device of claim 9, wherein the upper trench further has a recess at a point on which sidewalls of the upper trench and a bottom surface of the upper trench meet.

14. A semiconductor device comprising:

a substrate;

a first base fin and a second base fin, the first base fin and the second base fin protruding from the substrate and separated from each other in a first direction by a first deep trench;

a third base fin protruding from the substrate and separated from the second base fin in the first direction by a second deep trench;

a first fin type pattern protruding from the first base fin and extending in a second direction perpendicular to the first direction;

a second fin type pattern protruding from the second base fin and extending in the second direction;

a third fin type pattern protruding from the third base fin and extending in the second direction;

a field insulating film which fills the first deep trench and the second deep trench, and covers a part of sidewalls of the first to third fin type patterns; and a gate electrode intersecting the first fin type pattern, and extending in the second direction, wherein the first fin type pattern is in a transistor region of a first conductive type, the second fin type pattern and the third fin type pattern are in a transistor region of a second conductive type different from the first conductive type, a depth of the first deep trench is greater than a depth of the second deep trench, the first fin type pattern includes a lower fin type pattern, and an upper fin type pattern directly connected to the lower fin type pattern, the upper fin type pattern on the lower fin type pattern, the upper fin type pattern is silicon-germanium pattern, the lower fin type pattern is a silicon pattern, each of the second fin type pattern and the third fin type pattern is a silicon fin type pattern, and the gate electrode overlaps the upper fin type pattern in a third direction that is perpendicular to the first direction and the second direction.

15. The semiconductor device of claim 14, wherein the first deep trench includes an upper trench, and a lower trench on a bottom surface of the upper trench, a width of the upper trench is greater than a width of the lower trench, and a sidewall of the first base fin and a sidewall of the second base fin at least partially define the upper trench.

* * * * *